(12) United States Patent
Kwon et al.

(10) Patent No.: US 10,663,860 B2
(45) Date of Patent: May 26, 2020

(54) PHOTOSENSITIVE COMPOSITIONS, QUANTUM DOT POLYMER COMPOSITE PRODUCED THEREFROM, AND LAYERED STRUCTURES AND ELECTRONIC DEVICE INCLUDING THE SAME

(71) Applicant: SAMSUNG ELECTRONICS CO., LTD., Suwon-si, Gyeonggi-do (KR)

(72) Inventors: Ha Il Kwon, Suwon-si (KR); Tae Gon Kim, Hwaseong-si (KR); Jongmin Lee, Hwaseong-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 255 days.

(21) Appl. No.: 15/900,554

(22) Filed: Feb. 20, 2018

(65) Prior Publication Data

US 2018/0239247 A1    Aug. 23, 2018

(30) Foreign Application Priority Data

Feb. 20, 2017    (KR) .......................... 10-2017-0022578

(51) Int. Cl.
*G03F 7/027*    (2006.01)
*G02B 5/20*    (2006.01)
(Continued)

(52) U.S. Cl.
CPC ............ *G03F 7/0044* (2013.01); *C09K 11/02* (2013.01); *C09K 11/56* (2013.01); *C09K 11/70* (2013.01);
(Continued)

(58) Field of Classification Search
CPC ........ G03F 7/0007; G03F 7/027; G03F 7/028; G03F 7/033; G02B 5/201; G02B 5/206;
(Continued)

(56) References Cited

U.S. PATENT DOCUMENTS 8,876,272 B2    11/2014 Linton et al.
2013/0148057 A1*  6/2013 Kang ........................ C08K 9/08
                                                        349/64
(Continued)

FOREIGN PATENT DOCUMENTS

JP    2016-157114 A  *  9/2016
KR   1020160060904 A     5/2016
KR   1020160080281 A     7/2016

OTHER PUBLICATIONS

Computer-generated translation of JP 2016-157114 (Sep. 2016). (Year: 2016).*

*Primary Examiner* — John A McPherson
(74) *Attorney, Agent, or Firm* — Cantor Colburn LLP

(57) ABSTRACT

A photosensitive composition including a quantum dot; a carboxylic acid group-containing binder; a multi-thiol compound including at least two thiol groups at its terminal ends; a photopolymerizable monomer including a carbon-carbon double bond; a metal oxide fine particle including an organic compound represented by Chemical Formula 1 or a moiety derived from the organic compound at a surface of the metal oxide fine particle; a polymeric stabilizer; a photoinitiator; and a solvent, a production method thereof, a quantum dot polymer composite prepared therefrom, and a layered structure and an electronic device including the same are disclosed:

$(A)_n\text{Si}(R)_{4-n}$    Chemical Formula 1 wherein n, A, and R are the same as defined in the specification.

22 Claims, 10 Drawing Sheets
(1 of 10 Drawing Sheet(s) Filed in Color)

(51) Int. Cl.
| | |
|---|---|
| G02F 1/1335 | (2006.01) |
| G03F 7/004 | (2006.01) |
| G03F 7/16 | (2006.01) |
| G03F 7/20 | (2006.01) |
| G03F 7/32 | (2006.01) |
| G03F 7/40 | (2006.01) |
| G03F 7/075 | (2006.01) |
| C09K 11/02 | (2006.01) |
| C09K 11/70 | (2006.01) |
| C09K 11/56 | (2006.01) |
| G03F 7/031 | (2006.01) |
| G02F 1/13357 | (2006.01) |
| G03F 7/00 | (2006.01) |
| G03F 7/033 | (2006.01) |

(52) U.S. Cl.
CPC ....... *G02B 5/201* (2013.01); *G02F 1/133516* (2013.01); *G02F 1/133617* (2013.01); *G03F 7/0007* (2013.01); *G03F 7/0043* (2013.01); *G03F 7/0047* (2013.01); *G03F 7/027* (2013.01); *G03F 7/031* (2013.01); *G03F 7/033* (2013.01); *G03F 7/0752* (2013.01); *G03F 7/0755* (2013.01); *G03F 7/0758* (2013.01); *G03F 7/162* (2013.01); *G03F 7/168* (2013.01); *G03F 7/2002* (2013.01); *G03F 7/322* (2013.01); *G03F 7/40* (2013.01); *G02F 2202/36* (2013.01)

(58) Field of Classification Search
CPC ............... G02B 5/223; G02F 1/133514; G02F 1/133516; G02F 1/133617; G02F 2001/133614; G02F 2202/36; C09K 11/02; C09K 11/08
USPC .................................. 430/7, 281.1; 349/106
See application file for complete search history.

(56) References Cited

U.S. PATENT DOCUMENTS

| | | | |
|---|---|---|---|
| 2013/0242228 A1* | 9/2013 | Park | G02F 1/133377 349/61 |
| 2014/0192294 A1* | 7/2014 | Chen | F21V 9/08 349/69 |
| 2014/0370307 A1 | 12/2014 | Hao et al. | |
| 2015/0378216 A1* | 12/2015 | Oh | G02F 1/133609 349/69 |
| 2016/0272885 A1 | 9/2016 | Bai et al. | |
| 2017/0052444 A1* | 2/2017 | Park | C09K 11/703 |

* cited by examiner

Pattern Preparation by using a photoresist

Repeating the Patterning Process three times

PHOTOSENSITIVE COMPOSITIONS, QUANTUM DOT POLYMER COMPOSITE PRODUCED THEREFROM, AND LAYERED STRUCTURES AND ELECTRONIC DEVICE INCLUDING THE SAME

CROSS-REFERENCE TO RELATED APPLICATION

This application claims priority to Korean Patent Application No. 10-2017-0022578, filed in the Korean Intellectual Property Office on Feb. 20, 2017, and all the benefits accruing therefrom under 35 U.S.C. § 119, the content of which is incorporated herein in its entirety by reference.

BACKGROUND

1. Field

A photosensitive composition, a quantum dot-polymer composite prepared therefrom, and a layered structure and an electronic device including the same are disclosed.

2. Description of the Related Art

Quantum dots (e.g., semiconductor nanocrystal particles) may be used for various display devices (e.g., liquid crystal displays (LCDs)) in the form of a quantum dot (QD)-polymer composite. In order to be used in various devices, there remains a need to develop a technology for efficiently preparing a quantum dot-polymer composite or a pattern thereof that may show, e.g., exhibit, improved properties.

SUMMARY

An embodiment is related to a photosensitive composition from which a quantum dot-polymer composite or a pattern thereof may be prepared.

An embodiment is related to a production method of the aforementioned photosensitive composition.

An embodiment is related to a quantum dot-polymer composite or a pattern thereof prepared from the aforementioned photosensitive composition.

An embodiment provides a layered structure or a color filter including the quantum dot-polymer composite or a pattern thereof.

An embodiment provides an electronic device including the quantum dot-polymer composite or a pattern thereof.

In an embodiment, a photosensitive composition includes:
a quantum dot (e.g., a plurality of quantum dots);
a carboxylic acid group-containing binder;
a multi-thiol compound including at least two thiol groups at its terminal ends;
a photopolymerizable monomer including a carbon-carbon double bond;
a metal oxide fine particle including an organic compound represented by Chemical Formula 1 or a moiety derived from the organic compound at a surface of the metal oxide fine particle;
a photoinitiator; and
a solvent:

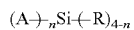  Chemical Formula 1 wherein n is an integer of 1 to 3 (e.g., 1, 2, or 3),
A is the same or different and is each independently a hydroxyl group, a C1 to C10 alkoxy group, chlorine, or a combination thereof, R is the same or different and is each independently a substituted or unsubstituted C3 to C40 aliphatic hydrocarbon; a substituted or unsubstituted C6 to C40 aromatic hydrocarbon; a substituted or unsubstituted C3 to C40 aliphatic hydrocarbon wherein at least one methylene group is replaced by a sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 alkyl group), or a combination thereof; a moiety represented by Chemical Formula 1-1; or a combination thereof;

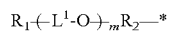  Chemical Formula 1-1 wherein $R_1$ is a C1 to C30 alkyl ester moiety, a C1 to C10 alkoxy group, or a C1 to C10 fluoroalkoxy group, $L^1$ is a C1 to C5 alkylene group or a C1 to C5 fluorinated alkyl group, $R_2$ is a single bond, a C1 to C20 alkylene group, or a C1 to C20 oxyalkylene group, \* is a portion linked to Si, and m is 1 to 40.

The quantum dot may include a Group II-VI compound, a Group III-V compound, a Group IV-VI compound, a Group IV element or compound, a Group I-III-VI compound, a Group I-II-IV-VI compound, or a combination thereof.

The quantum dot may include an organic ligand bound to a surface thereof. The organic ligand may include a hydrophobic moiety. In some embodiments, the organic ligand does not include a photopolymerizable functional group such as a (meth)acrylate.

The carboxylic acid group-containing binder may have an acid value of greater than or equal to about 50 milligrams of KOH per gram and less than or equal to about 250 milligrams of KOH per gram. The carboxylic acid group-containing polymer may have an acid value of about 100 mg KOH/gram to 200 mg KOH/gram.

The carboxylic acid group-containing binder may include a copolymer of a monomer combination including a first monomer including a carboxylic acid group and a carbon-carbon double bond, a second monomer including a carbon-carbon double bond and a hydrophobic moiety and not including a carboxylic acid group, and optionally, a third monomer including a carbon-carbon double bond and a hydrophilic moiety and not including a carboxylic acid group; a multiple aromatic ring-containing polymer including a carboxylic acid group and including a backbone structure in a main chain, wherein the backbone structure includes a quaternary carbon atom, which is a part of a cyclic group, and two aromatic rings bound to the quaternary carbon atom; or a combination thereof.

The copolymer of the carboxylic acid group-containing binder may include a first repeating unit derived from the first monomer, a second repeating unit derived from the second monomer, and optionally a third repeating unit derived from the third monomer.

The first repeating unit may include a unit represented by Chemical Formula 1-A, a unit represented by Chemical Formula 1-B, or a combination thereof:

Chemical Formula 1-A

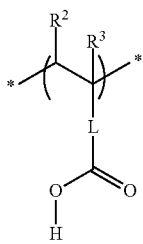

wherein
R[1] is hydrogen, a C1 to C3 alkyl group, or —(CH$_2$)$_n$—COOH (wherein n is 0 to 2),
R[2] is hydrogen, a C1 to C3 alkyl group, or —COOH,
L is a single bond, a divalent C1 to C15 alkylene group, or a C6 to C12 arylene group, and
* indicates a portion linked to an adjacent atom (e.g., in its main chain);

Chemical Formula 1-B

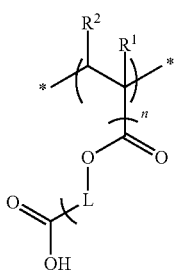

wherein
R[1] is hydrogen, a C1 to C3 alkyl group, or —(CH$_2$)$_n$—COOH (wherein n is 0 to 2),
R[2] is hydrogen or a C1 to C3 alkyl group,
L is a single bond, a C1 to C15 alkylene group, a C1 to C15 alkylene group wherein at least one methylene group is replaced with —C(=O)—, —O—, —C(=O)O—, or a combination thereof, a C6 to C30 arylene group, or a divalent C3 to C30 alicyclic hydrocarbon group,
n is an integer of 1 to 3, and
* indicates a portion linked to an adjacent atom.

The second repeating unit may include a unit represented by Chemical Formula 2, a unit represented by Chemical Formula 4, a unit represented by Chemical Formula 5, a unit represented by Chemical Formula A, or a combination thereof:

Chemical Formula 2

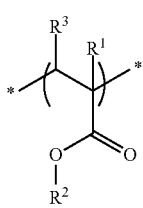

wherein
R[1] is hydrogen or a C1 to C3 alkyl group,
R[2] is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R[3] is hydrogen or a C1 to C3 alkyl group, and
* indicates a portion linked to an adjacent atom;

Chemical Formula 4

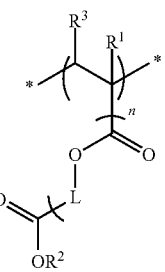

wherein
R[1] is hydrogen, or a C1 to C3 alkyl group,
L is a single bond, a C1 to C15 alkylene group, a C1 to C15 alkylene group wherein at least one methylene group is replaced with —C(=O)—, —O—, —C(=O)O—, or a combination thereof, a C6 to C30 arylene group, or a divalent C3 to C30 alicyclic hydrocarbon group,
R[2] is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R[3] is hydrogen or a C1 to C3 alkyl group,
n is an integer of 1 to 3, and
* indicates a portion linked to an adjacent atom;

Chemical Formula 5

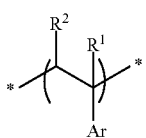

wherein
each of R[1] and R[2] is independently hydrogen or a C1 to C3 alkyl group,
Ar is a substituted or unsubstituted C6 to C30 aryl group or a substituted or unsubstituted C3 to C30 alicyclic group, and
* indicates a portion linked to an adjacent atom;

Chemical Formula A

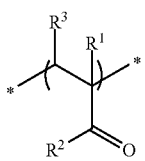

wherein
R[1] is hydrogen or a C1 to C3 alkyl group,
R[2] is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit may be represented by Chemical Formula 3:

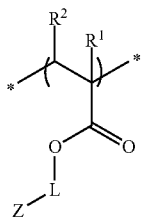

Chemical Formula 3 wherein each of $R^1$ and $R^2$ is independently hydrogen or a C1 to C3 alkyl group, L is a C1 to C15 alkylene group, a C1 to C15 alkylene group wherein at least one methylene group is replaced with —C(═O)—, —O—, —C(═O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

The backbone structure of the multiple aromatic ring-containing polymer may include a repeating unit represented by Chemical Formula B:

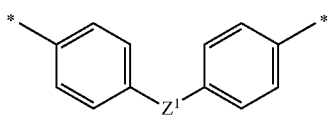

Chemical Formula B wherein

* indicates a portion that is linked to an adjacent atom of the main chain of the binder, $Z^1$ is a linking moiety represented by any one of Chemical Formulae B-1 to B-6, and in Chemical Formulae B-1 to B-6, * indicates a portion that is linked to the aromatic ring:

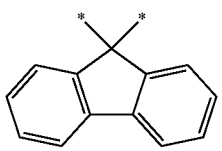

Chemical Formula B-1

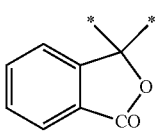

Chemical Formula B-2

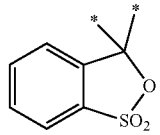

Chemical Formula B-3

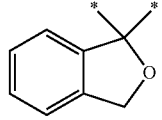

Chemical Formula B-4

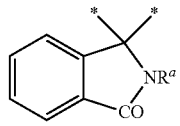

Chemical Formula B-5 wherein $R^a$ is hydrogen, an ethyl group, C2H4Cl, $C_2H_4OH$, $CH_2CH═CH_2$, or a phenyl group,

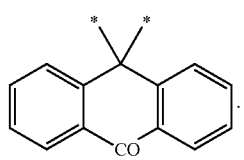

Chemical Formula B-6

In the copolymer of the carboxylic acid group-containing binder, an amount of the first repeating unit may be greater than or equal to about 5 mole percent (mol %), and less than or equal to about 95 mol %, an amount of the second repeating unit may be greater than or equal to about 5 mole percent (mol %), and less than or equal to about 95 mol %, and an amount of the third repeating unit may be less than or equal to about 40 mol %.

The carboxylic acid group-containing binder may have a weight molecular weight of greater than or equal to about 1,000 grams per mole (g/mol) and less than or equal to about 100,000 g/mol.

The photopolymerizable monomer including the carbon-carbon double bond may include a (meth)acrylate monomer including at least one (meth)acrylate group (e.g., two, three, four, five, six, seven, eight, or more (meth)acrylate groups).

The photopolymerizable monomer including the carbon-carbon double bond may include a hyper-branched oligomer including at least eight (meth)acrylate group.

The multi-thiol compound may be represented by Chemical Formula 6:

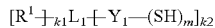

Chemical Formula 6 wherein, $R^1$ is hydrogen, a substituted or unsubstituted C1 to C40 linear or branched alkyl group, a C2 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, or a substituted or unsubstituted C2 to C30 alkylene group or a substituted or unsubstituted C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$ when $Y_1$ is not a single bond, and provided that a sum of k1 and k2 does not exceed the valence of $L_1$.

The metal oxide fine particle may have an average particle size of greater than or equal to about 100 nanometers (nm) and less than or equal to about 1,000 nm. The metal oxide fine particle may have an average particle size of greater than or equal to about 150 nm and less than or equal to about 300 nm. The metal oxide fine particles may be non-light emitting.

The metal oxide fine particle may include a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof. The metal oxide fine particle may include $TiO_2$, $SiO_2$, $BaTiO_3$, $Ba_2TiO_4$, ZnO, $HfO_2$, $ZrO_2$, $Al_2O_3$, $Ga_2O_3$, $In_2O_3$, $GeO_2$, $SnO_2$, $Sb_2O_3$, $Sc_2O_3$, $Y_2O_3$, $La_2O_3$, $RuO_2$, $CeO_2$, $TaO_2$, $Nb_2O_5$, or a combination thereof.

The organic compound may include an organic silane compound represented by Chemical Formula 1-1-1:

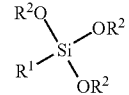

Chemical Formula 1-1-1 wherein $R^1$ is a C3 to C30 (e.g., C5 to C16) alkyl group, a C6 to C30 (e.g., C6 to C16) aryl group, a C3 to C30 (e.g., C5 to C16) mercaptoalkyl group, a C3 to C30 (e.g., C5 to C16) alkyl group substituted with (meth)acrylate group, a C3 to C30 (e.g., C5 to C16) alkyl group substituted with a vinyl group, or a C3 to C30 (e.g., C5 to C16) alkyl group substituted with an epoxy group, and $R^2$ are the same or different, and is each independently hydrogen or a C1 to C3 alkyl group.

The organic compound may include an organic silane oligomer represented by Chemical Formula 1-1-2, Chemical Formula 1-1-3, or Chemical Formula 1-1-4:

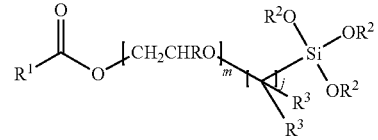

Chemical Formula 1-1-2 wherein $R^1$ is a C1 to C15 alkyl group,

R are the same or different, and is each independently hydrogen or a C1 to C5 alkyl group, m is an integer of 1 to 30 (e.g., 1 to 5), $R^2$ are the same or different, and is each independently hydrogen or a C1 to C3 alkyl group, $R^3$ are the same or different, and is each independently hydrogen or a methyl group, j is an integer of 1 to 20 (e.g., 1 to 10),

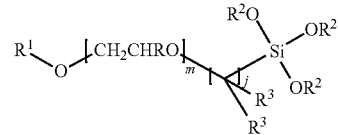

Chemical Formula 1-1-3 wherein $R^1$ is a C1 to C3 alkyl group,

R are the same or different, and is each independently hydrogen or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, j is an integer of 1 to 20 (e.g., 1 to 10),

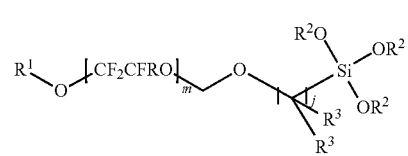

Chemical Formula 1-1-4 wherein R¹ is a C1 to C10 fluorinated alkyl group,

R are the same or different, and is each independently hydrogen, fluorine, or a C1 to C5 alkyl group, m is an integer of 1 to 30, R² are the same or different, and is each independently hydrogen or a C1 to C3 alkyl group, R³ are the same or different, and is each independently hydrogen or methyl group, and j is an integer of 1 to 20 (e.g., 1 to 10).

The organosilane oligomer may have a weight average molecular weight of greater than or equal to about 100 g/mol, greater than or equal to about 150 g/mol, greater than or equal to about 200 g/mol and less than or equal to about 5,000 g/mol, less than or equal to about 4,500 g/mol, less than or equal to about 4,000 g/mol, less than or equal to about 3,500 g/mol, less than or equal to about 2,500 g/mol, less than or equal to about 2,000 g/mol, less than or equal to about 1,500 g/mol, less than or equal to about 1,000 g/mol, or less than or equal to about 650 g/mol.

The photosensitive composition may include a plurality of quantum dots and in the photosensitive composition, based on a total weight of the composition, an amount of the plurality of quantum dots may be greater than or equal to about 1 weight percent and less than or equal to about 60 weight percent;

an amount of the carboxylic acid group-containing binder may be greater than or equal to about 0.5 weight percent to about 60 weight percent;

an amount of the multi-thiol compound may be greater than or equal to about 0.1 weight percent and less than or equal to about 50 weight percent;

an amount of the photopolymerizable monomer may be greater than or equal to about 1 weight percent and less than or equal to about 70 weight percent;

an amount of the metal oxide fine particle may be greater than or equal to about 0.01 weight percent and less than or equal to about 50 weight percent; and an amount of the photoinitiator may be greater than or equal to about 0.01 weight percent and less than or equal to about 10 weight percent; and a balance amount may be the solvent.

In an embodiment, a production method of the aforementioned photosensitive composition includes:

obtaining a binder solution including (e.g., by mixing) a carboxylic acid group-containing binder and a solvent;

combining a plurality of quantum dots (that may include an organic ligand bound to a surface thereof) with the solution to obtain a quantum dot dispersion; and combining the quantum dot dispersion with a multi-thiol compound, a photopolymerizable monomer including a carbon-carbon double bond, a photoinitiator, and a metal oxide fine particle including an organic compound represented by Chemical Formula 1 or a moiety derived therefrom.

The production method may further include reacting a metal oxide fine particle with the organic compound in an organic solvent at a temperature of greater than or equal to about 60° C. to obtain the metal oxide fine particle including an organic compound represented by Chemical Formula 1 at a surface thereof.

In some embodiments, a quantum dot-polymer composite includes a polymer matrix including a carboxylic acid group-containing binder and a polymerization product of a multi-thiol compound including at least two thiol at its end terminals and a photopolymerizable monomer; and a plurality of quantum dots dispersed in the polymer matrix; and a metal oxide fine particle including an organic compound represented by Chemical Formula 1 or a moiety derived from the organic compound at a surface of the metal oxide fine particle and for example dispersed in the polymer matrix:

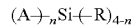  Chemical Formula 1 wherein n is an integer of 1 to 3 (e.g., 1, 2, or 3), A is the same or different and is each independently a hydroxyl group, a C1 to C10 alkoxy group, chlorine, or a combination thereof, R is the same or different and is each independently a substituted or unsubstituted C3 to C40 aliphatic hydrocarbon; a substituted or unsubstituted C6 to C40 aromatic hydrocarbon; a substituted or unsubstituted C3 to C40 aliphatic hydrocarbon wherein at least one methylene group is replaced by a sulfonyl (—S(═O)₂—), carbonyl (—C(═O)—), ether (—O—), sulfide (—S—), sulfoxide (—S(═O)—), ester (—C(═O)O—), amide (—C(═O)NR—) (wherein R is hydrogen or a C1 to C10 alkyl group), or a combination thereof; a moiety represented by Chemical Formula 1-1; or a combination thereof;

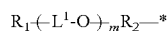  Chemical Formula 1-1 wherein R₁ is a substituted or unsubstituted C1 to C30 alkyl ester moiety, a substituted or unsubstituted C1 to C10 alkoxy group, or a C1 to C10 fluoroalkoxy group, L¹ is a substituted or unsubstituted C1 to C5 alkylene group or a substituted or unsubstituted C1 to C5 fluorinated alkyl group, R₂ is a single bond, a substituted or unsubstituted C1 to C20 alkylene group, or a substituted or unsubstituted C1 to C20 oxyalkylene group,

* is a portion linked to Si, and m is 1 to 40.

The carboxylic acid group-containing binder may include a copolymer of a monomer combination including a first monomer including a carboxylic acid group and a carbon-carbon double bond, a second monomer including a carbon-carbon double bond and a hydrophobic moiety and not including a carboxylic acid group, and optionally, a third monomer including a carbon-carbon double bond and a hydrophilic moiety and not including a carboxylic acid group; a multiple aromatic ring-containing polymer including a carboxylic acid group and including a backbone structure in a main chain, wherein the backbone structure includes a quaternary carbon atom, which is a part of a cyclic group, and two aromatic rings bound to the quaternary carbon atom; or a combination thereof.

The metal oxide fine particle may have an average particle size of greater than or equal to about 100 nm and less than or equal to about 1,000 nm. The metal oxide fine particle may have an average particle size of greater than or equal to about 150 nm and less than or equal to about 300 nm. The metal oxide fine particles may be non-light emitting.

The metal oxide fine particle may include a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof. The metal oxide fine particle may include $TiO_2$, $SiO_2$, $BaTiO_3$, $Ba_2TiO_4$, $ZnO$, $HfO_2$, $ZrO_2$, $Al_2O_3$, $Ga_2O_3$, $In_2O_3$, $GeO_2$, $SnO_2$, $Sb_2O_3$, $Sc_2O_3$, $Y_2O_3$, $La_2O_3$, $RuO_2$, $CeO_2$, $TaO_2$, $Nb_2O_5$, or a combination thereof.

The organic compound may include an organic silane compound represented by Chemical Formula 1-1-1:

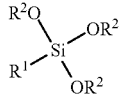

Chemical Formula 1-1-1 wherein $R^1$ is a C3 to C30 (e.g., C5 to C16) alkyl group, a C6 to C30 (e.g., C6 to C16) aryl group, a C3 to C30 (e.g., C5 to C16) mercaptoalkyl group, a C3 to C30 (e.g., C5 to C16) alkyl group substituted with (meth)acrylate group, a C3 to C30 (e.g., C5 to C16) alkyl group substituted with a vinyl group, or a C3 to C30 (e.g., C5 to C16) alkyl group substituted with an epoxy group, and $R^2$ are the same or different, and is each independently hydrogen or a C1 to C3 alkyl group.

The organic compound may include an organic silane oligomer represented by Chemical Formula 1-1-2, Chemical Formula 1-1-3, or Chemical Formula 1-1-4:

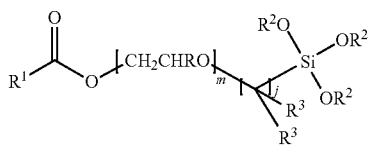

Chemical Formula 1-1-2 wherein $R^1$ is a C1 to C15 alkyl group,

R are the same or different, and is each independently hydrogen or a C1 to C5 alkyl group, m is an integer of 1 to 30 (e.g., 1 to 5), $R^2$ are the same or different, and is each independently hydrogen or a C1 to C3 alkyl group, $R^3$ are the same or different, and is each independently hydrogen or a methyl group, j is an integer of 1 to 20 (e.g. an integer of 1 to 10),

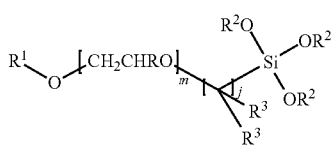

Chemical Formula 1-1-3 wherein $R^1$ is a C1 to C3 alkyl group,

R are the same or different, and is each independently hydrogen or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, j is an integer of 1 to 20,

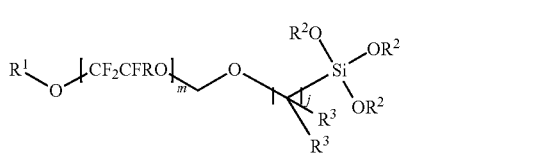

Chemical Formula 1-1-4 wherein $R^1$ is a C1 to C10 fluorinated alkyl group,

R are the same or different, and is each independently hydrogen, fluorine, or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, and j is an integer of 1 to 20 (e.g., 1 to 10).

The organosilane oligomer may have a weight average molecular weight of greater than or equal to about 100 g/mol and less than or equal to about 5,000 g/mol.

Based on a total weight of the composite, an amount of the plurality of quantum dots may be greater than or equal to about 1 weight percent and less than or equal to about 70 weight percent;

an amount of the metal oxide fine particle may be greater than or equal to about 1 weight percent and less than or equal to about 50 weight percent; and an amount of the polymer matrix may be greater than or equal to about 1 weight percent and less than or equal to about 80 weight percent The quantum dot polymer composite may have a photo-conversion rate of greater than or equal to about 50% (e.g., greater than or equal to about 60%) of an initial value thereof after a 30 minute heat-treatment at a temperature of 180° C.

The quantum dot polymer composite may have a photo-conversion efficiency of greater than or equal to about 30% after a 30 minute heat-treatment at a temperature of 180° C.

The quantum dot polymer composite may be a pattern.

In some embodiments, a layered structure includes a substrate (e.g., a transparent substrate); and a luminescent layer (e.g., photoluminescent layer) disposed on the substrate and including a pattern of the quantum dot polymer composite, the pattern of the quantum dot polymer composite includes a repeating section including a first section configured to emit light of a first light.

The repeating section may further include a second section configured to emit a second light that is different from the first light, a third section configured to emit a third light that is different from the first light and the second light, or a combination thereof.

At least one of the second section and the third section may include the quantum dot polymer composite.

A maximum photoluminescent peak wavelength of the first section may be in a range of greater than about 480 nm and less than or equal to about 580 nm or in a range of greater than about 580 nm and less than or equal to about 680 nm.

A maximum photoluminescent peak wavelength of the second section may be in a range of greater than about 480 nm and less than or equal to about 580 nm or in a range of greater than about 580 nm and less than or equal to about 680 nm.

A maximum photoluminescent peak wavelength of the third section may be in a range of greater than or equal to about 380 and less than or equal to about 480 nm.

In some embodiments, an electronic device includes the aforementioned quantum dot polymer composite (or a pattern thereof). The electronic devices may include a light emitting diode (LED), an organic light emitting diode (OLED), a sensor, an imaging sensor, a solar cell, or a liquid crystal display device.

From the aforementioned photosensitive composition, a quantum dot-polymer composite pattern may be produced in an environmentally friendly manner. The photosensitive composition of the embodiments may be applied to a conventional photo-resist process without any additional surface treatment for the quantum dots.

The photosensitive composition of the embodiments may show, e.g., exhibit, improved storage stability and heat stability and a pattern prepared therefrom may show enhanced luminous efficiency even after a relatively high temperature heat-treatment carried out during a process involving a photoresist.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
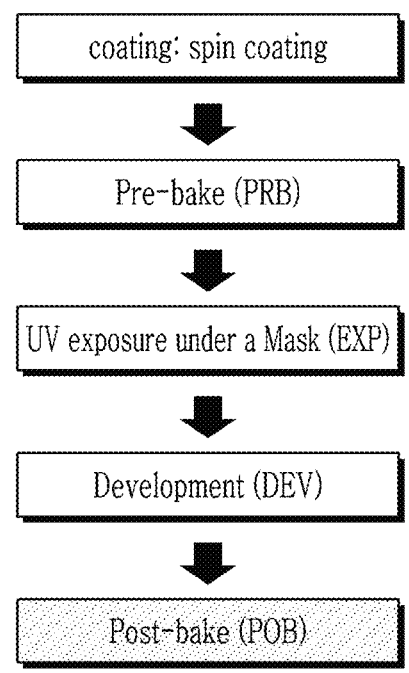
FIG. 1 is a schematic diagram illustrating an exemplary embodiment of a method of producing a quantum dot polymer composite pattern.
Figure 1:
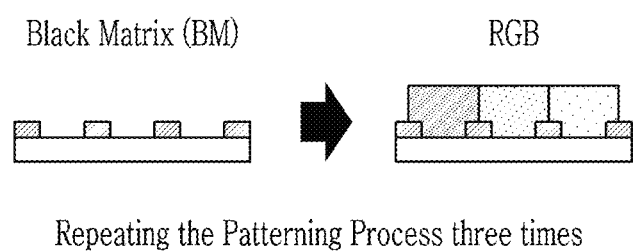

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first". "second", "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a compound or a group or a moiety wherein at least one hydrogen atom thereof is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents.

As used herein, when a definition is not otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate. The (meth)acrylate can be a (C1 to C10 alkyl)acrylate or a (C1 to C10 alkyl)methacrylate.

As used herein, the term "hydrophobic moiety" refers to a moiety that causes a given compound including the same to show agglomeration in an aqueous solution and to have a tendency to repel water. For example, the hydrophobic moiety may include an aliphatic hydrocarbon group (alkyl, alkenyl, alkynyl, etc.) having at least one (e.g., at least two, three, four, five, or six, or higher), carbon atoms, an aromatic hydrocarbon group (phenyl, naphthyl, arylalkyl group, etc.) having at least six carbon atoms, or an alicyclic hydrocarbon group (cyclohexyl, norbornenyl, etc.) having at least five carbon atoms. The hydrophobic moiety substantially lacks an ability to make a hydrogen bond with an ambient medium and is not substantially mixed with the medium as its polarity does not match that of the medium.

As used herein, the term "visible light" refers to light having a wavelength of about 390 nanometers (nm) to about 700 nm. As used herein, the term ultraviolet ("UV") may refer to light having a wavelength of greater than or equal to about 200 nm and less than about 390 nm.

As used herein, when a definition is not otherwise provided, the term "dispersion" refers to a dispersion, wherein a dispersed phase includes a solid and a continuous phase includes a liquid. For example, the term "dispersion" may refer to a colloidal dispersion wherein the dissolved or dispersed phase has a dimension of about 1 nm to about several micrometers (μm) (e.g., 1 μm or less, 2 μm or less, or 3 μm or less).

As used herein, when a definition is not otherwise provided, the term "Group" in the term Group III, Group II, and the like refers to a group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and TI, but are not limited thereto.

"Group IV" refers to a Group IVA and a Group IVB, and examples of the Group IV metal may include Si, Ge, and Sn but are not limited thereto. As used herein, the term "a metal" may include a semi-metal such as Si.

"Group I" refers to a Group IA and a Group IB, and may include Li, Na, K, Rb, and Cs but are not limited thereto.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto.

In an embodiment, a photosensitive composition includes: quantum dot(s); a metal oxide fine particle including a Si-containing organic compound or a moiety derived from the Si-containing organic compound at a surface thereof; a photoinitiator; a carboxylic acid group (—COOH)-containing binder; a multi-thiol compound having at least two thiol groups at its terminal ends (e.g., including a thiol group at each terminal end of the multi-thiol compound); a photopolymerizable monomer having a carbon-carbon double bond; and a solvent. In the photosensitive composition of an embodiment, the plurality of quantum dots may be dispersed (for example, separated from one another) by the carboxylic acid group (—COOH)-containing binder to form a quantum dot dispersion (e.g., quantum dot binder dispersion). The quantum dot dispersion includes the carboxylic acid group (—COOH)-containing binder and the plurality of quantum dots dispersed in the carboxylic acid group (—COOH)-containing binder. The quantum dot dispersion may further include a solvent.

The quantum dot (hereinafter also referred to as a semiconductor nanocrystal) may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be selected from:

a binary element compound including CdSe, CdTe, ZnS, ZnSe, ZnTe, ZnO, HgS, HgSe, HgTe, MgSe, MgS, or a combination thereof;

a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may be selected from:

a binary element compound including GaN, GaP, GaAs, GaSb, AlN, AlP, AlAs, AlSb, InN, InP, InAs, InSb, or a combination thereof;

a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may be selected from:

a binary element compound including SnS, SnSe, SnTe, PbS, PbSe, PbTe, or a combination thereof;

a ternary element compound including SnSeS, SnSeTe, SnSTe, PbSeS, PbSeTe, PbSTe, SnPbS, SnPbSe, SnPbTe, or a combination thereof; and a quaternary element compound including SnPbSSe, SnPbSeTe, SnPbSTe, or a combination thereof.

Examples of the Group I-III-VI compound may include CuInSe$_2$, CuInS$_2$, CuInGaSe, and CuInGaS, but are not limited thereto.

Examples of the Group I-II-IV-VI compound may include CuZnSnSe and CuZnSnS, but are not limited thereto.

The Group IV element or compound may be selected from:

a single-element including Si, Ge, or a combination thereof; and a binary element compound including SiC, SiGe, or a combination thereof.

In some embodiments, the quantum dot does not include cadmium.

The binary element compound, the ternary element compound, or the quaternary element compound may be respectively included in a uniform concentration in the particle or partially different concentrations in the same particle, for example as a gradient. The semiconductor nanocrystal particle may include a core including a first semiconductor nanocrystal and a shell disposed on at least a portion (or the entire) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases toward the core). In addition, the shell may include a multi-layered shell having at least two layers wherein adjacent layers have different composition each other. In the multi-layered shell, each layer may have a single composition. In the multi-layered shell, each layer may have an alloy. In the multi-layered shell, each layer may have a concentration gradient that changes radially in light of a composition of a semiconductor nanocrystal.

In the core-shell semiconductor nanocrystal particle, the materials of the shell may have a bandgap energy that is greater than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (a layer that is closer to the core). Absorption and light emitting wavelength of the quantum dot may be controlled by varying a composition and/or a size thereof. For example, a maximum photoluminescent peak wavelength of the quantum dot may emit light of a UV to infrared wavelength range or of a wavelength greater than the foregoing range.

A maximum photoluminescent peak wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm. A maximum photoluminescent peak wavelength of the quantum dot may be less than or equal to about 800 nm, less than or equal to about 700 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm.

A maximum photoluminescent peak wavelength of the quantum dot may be present in a range of about 500 nm to about 650 nm. A maximum photoluminescent peak wavelength of the quantum dot may be present in a range of about 500 nm to about 540 nm. A maximum photoluminescent peak wavelength of the quantum dot may be present in a range of about 610 nm to about 640 nm.

The quantum dot may have a quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%. The quantum dot may have a full width half maximum (FWHM) of less than or equal to about 45 nm, for example less than or equal to about 40 nm, less than or equal to about 39 nm, less than or equal to about 38 nm, less than or equal to about 37 nm, less than or equal to about 36 nm, less than or equal to about 35 nm, or less than or equal to about 30 nm.

The quantum dot may have a size (e.g., particle diameter or in the case of a non-spherically shaped particle, a diameter calculated from a two dimensional area of an electron microscopic image of the particle) of about 1 nm to about 100 nm. In some embodiments, the quantum dot may have a particle diameter of about 1 nm to about 50 nm, for example, from 2 nm (or from 3 nm) to 35 nm. In some embodiments, the quantum dot have a diameter of greater than or equal to about 1 nm, greater than or equal to about 2 nm, greater than or equal to about 3 nm, greater than or equal to about 4 nm, or greater than or equal to about 5 nm. In some embodiments, the quantum dot have a diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, or less than or equal to about 10 nm.

Shapes of the quantum dot are not particularly limited. For example, the shape of the quantum dot may include a sphere, a polyhedron, a pyramid, a multi-pod, a cube, a rectangular parallelepiped, a nanotube, a nanowire, a nanosheet, a nanorod, or a combination thereof, but are not limited thereto.

The quantum dot may be commercially available or may be synthesized in any method. In a colloidal synthesis, a particle size of the quantum dot may relatively easily controlled and a distribution of the size may be uniformly controlled. When the quantum dot has a size of less than or equal to about 10 nm, the quantum confinement effect may be more significant as its size becomes smaller and thereby an energy density may increase. During the colloidal synthesis, precursors may react in an organic solvent to grow nanocrystal particles, and the organic solvent or a ligand compound may coordinate (or be bound) to a surface of the quantum dot, thereby controlling the growth of the nanocrystal. Examples of the organic solvent and ligand compound are known.

After the synthesis, an extra, e.g., excess, amount of organics (e.g., organic solvents and/or organic ligands) that are not coordinated (or bound) to a surface of the quantum dot may be removed by a re-precipitation process using an excess amount of a non-solvent. Examples of the non-solvent include acetone, ethanol, methanol, and the like, but are not limited thereto.

The quantum dot may include an organic ligand having a hydrophobic moiety and optionally not having a photopolymerizable moiety such as a (meth)acrylate or a vinyl moiety for example at its terminal ends. The organic ligand may be bound (e.g., coordinated) to a surface of the quantum dot. In an embodiment, the organic ligand may include $RCOOH$, $RNH_2$, $R_2NH$, $R_3N$, $R_3PO$, $R_3P$, $ROH$, $RCOOR'$, $RPO(OH)_2$, $R_2POOH$ (wherein R and R' are the same or different, and are independently hydrogen, a C1 to C40 aliphatic hydrocarbon such as C1 to C40 or C5 to C24 alkyl group or a C1 to C40 or C5 to C24 alkenyl group or a C6 to C40 aromatic hydrocarbon such as a C5 to C20 aryl group, provided that at least one R group in each ligand is not hydrogen), a polymeric organic ligand, or a combination thereof.

Examples of the organic ligand compound may include:
amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;
carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;
phosphine compounds such as methyl phosphine, ethyl phosphine, propyl phosphine, butyl phosphine, pentyl phosphine, octyl phosphine, dioctyl phosphine, tributyl phosphine, or trioctyl phosphine;
phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;
diphenyl phosphine, triphenyl phosphine, or oxide compounds thereof;
a mono- or di(C5 to C20 alkyl)phosphinic acid such as mono- or dihexylphosphinic acid, mono- or dioctylphosphinic acid, mono- or didodecylphosphinic acid, mono- or di(tetradecyl)phosphinic acid, mono- or di(hexadecyl)phosphinic acid, or mono- or di(octadecyl)phosphinic acid;
a C5 to C20 alkylphosphonic acid such as hexylphosphonic acid, octylphosphonic acid, dodecylphosphonic acid, tetradecylphosphonic acid, hexadecylphosphonic acid, or octadecylphosphonic acid;
and the like, but are not limited thereto.

In some embodiments, the quantum dot may further include a single (hydrophobic) organic ligand or at least two (hydrophobic) organic ligands selected from the foregoing. The hydrophobic organic ligand may not include a photopolymerizable moiety.

In some embodiments, the amount of the quantum dot may be greater than or equal to about 1 percent by weight (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 25 wt %, or greater than or equal to about 30 wt %, based on the total weight of the composition or the solid content (i.e., non-volatiles) thereof. The amount of the quantum dot may be less than or equal to about 70 wt %, less than or equal to about 60 wt %, for example, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 17 wt %, or less than or equal to about 15 wt %, based on the total weight of the composition or the solid content. In some embodiments, the amount of the quantum dot including the organic ligand may be from 2 wt % to about 70 wt %, based on the total weight of the composition or the solid content thereof. As used herein, an amount of a component based on the solid content may represent the amount of the component in a composite.

The photosensitive composition may include a metal oxide fine particle, in particular a plurality of metal oxide fine particles. The metal oxide fine particle may be non-light emitting. The metal oxide fine particle may include a Si containing organic compound or a moiety derived from the Si containing organic compound at a surface thereof. For example, the Si containing organic compound may be bound to a surface of the metal oxide fine particle.

The Si containing organic compound may be represented by Chemical Formula 1:

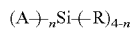  Chemical Formula 1 wherein n is an integer of 1 to 3 (e.g., 1, 2, or 3), A is the same or different and is each independently a hydroxyl group, a C1 to C10 alkoxy group (e.g., methoxy or ethoxy), chlorine, or a combination thereof, R is the same or different and is each independently a substituted or unsubstituted C3 to C40 aliphatic hydrocarbon (for example, a C3 to C40 straight or branched alkyl, a C3 to C40 straight or branched alkenyl, a C3 to C40 straight or branched mercapto alkyl, a C3 to C40 straight or branched alkyl group having a (meth)acrylate moiety at its terminal end); a substituted or unsubstituted C3 to C40 aliphatic hydrocarbon wherein at least one methylene group is replaced by a sulfonyl (—S(═O)$_2$—), carbonyl (—C(═O)—), ether (—O—), sulfide (—S—), sulfoxide (—S(═O)—), ester (—C(═O)O—), amide (—C(═O)NR—) (wherein R is hydrogen or a C1 to C10 alkyl group), or a combination thereof; a moiety represented by Chemical Formula 1-1; a C6 to C40 substituted or unsubstituted aromatic hydrocarbon or a combination thereof:

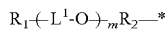  Chemical Formula 1-1 wherein $R_1$ is a substituted or unsubstituted C1 to C30 alkyl ether moiety, a substituted or unsubstituted C1 to C10 alkoxy group, or a substituted or unsubstituted C1 to C10 fluoroalkoxy group, $L^1$ is a C1 to C5 alkylene group or a C1 to C5 fluorinated alkyl group, $R_2$ is a single bond, a substituted or unsubstituted C1 to C20 alkylene group, or a substituted or unsubstituted C1 to C20 oxyalkylene group,

* is a portion linked to Si, and m is 1 to 40.

In the above Chemical Formula 1-1, the C1 to C30 alkyl ester moiety may include RCOO— and/or ROCO (wherein R is a C1 to C30 alkyl group). In the above Chemical Formula 1, the R and the $R_1$ in the Chemical Formula 1-1 may not include an amine group at its terminal end.

The organic compound may include an organic silane compound represented by Chemical Formula 1-1-1:

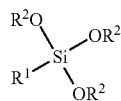

Chemical Formula 1-1-1 wherein $R^1$ is a C3 to C30 (e.g., C5 to C16) alkyl group, a C3 to C30 (e.g., C5 to C16) mercaptoalkyl group, a C3 to C30 (e.g., C5 to C16) alkyl group substituted with (meth)acrylate group, a C3 to C30 (e.g., C5 to C16) alkyl group substituted with a vinyl group, a C3 to C30 (e.g., C5 to C16) alkyl group substituted with an epoxy group, or a C6 to C30 substituted or unsubstituted aryl group and $R^2$ are the same or different, and is each independently hydrogen or a C1 to C3 alkyl group.

In some embodiments, the organic silane compound may include hexadecyltrimethoxy silane, hexyltrimethoxy silane, 3-methacryloxypropyl trimethoxy silane, 3-mercaptopropyl trimethoxy silane, isobutyltrimethoxy silane, octyltrimethoxy silane, phenyltrimethoxy silane, or a combination thereof.

In some embodiments, the organic compound may include an organic silane oligomer represented by Chemical Formula 1-1-2, Chemical Formula 1-1-3, or Chemical Formula 1-1-4:

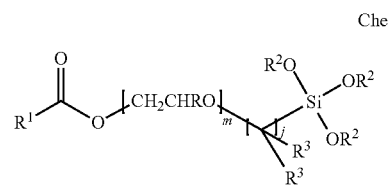

Chemical Formula 1-1-2 wherein $R^1$ is a C1 to C15 substituted or unsubstituted alkyl group,

R are the same or different, and is each independently hydrogen or a C1 to C5 alkyl group, m is an integer of 1 to 30 (e.g., 1 to 5), $R^2$ are the same or different, and is each independently hydrogen or a C1 to C3 alkyl group, $R^3$ are the same or different, and is each independently hydrogen or a methyl group, j is an integer of 1 to 20 (e.g., 1 to 10),

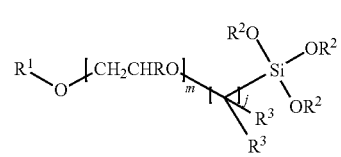

Chemical Formula 1-1-3 wherein $R^1$ is a C1 to C3 substituted or unsubstituted alkyl group,

R are the same or different, and is each independently hydrogen or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, j is an integer of 1 to 20, Chemical Formula 1-1-4

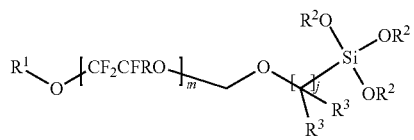

wherein $R^1$ is a C1 to C10 fluorinated alkyl group,

R are the same or different, and is each independently hydrogen, fluorine, a C1 to C10 alkyl group, or C1 to C10 fluoroalkyl group, m is an integer of 1 to 30, $R^2$ are the same or different, and is each independently hydrogen or a C1 to C3 alkyl group, $R^3$ are the same or different, and is each independently hydrogen or methyl group, and j is an integer of 1 to 20 (e.g., 1 to 10).

Examples of the organosilane oligomer may include the compounds set forth in Table 1 but are not limited thereto.

TABLE 1

| Chemical Structure | Molecular Weight of Amphiphilic Moiety |
|---|---|
|  | 373 |
|  | 318 |
|  | 205 |
|  | 337-469 |
|  | 469-601 |
|  | 997-1129 |
|  | 1087 (n = 5)- 3577 (n = 20) |

The organosilane oligomer may have a weight average molecular weight of greater than or equal to about 100 g/mol, greater than or equal to about 200 g/mol, or greater than or equal to about 300 g/mol and less than or equal to about 5,000 g/mol, or less than or equal to about 4,500 g/mol.

An average particle size of the metal oxide fine particles may be greater than or equal to about 100 nm, for example, greater than or equal to about 150 nm, greater than or equal to about 160 nm, greater than or equal to about 170 nm, greater than or equal to about 180 nm, or greater than or equal to about 190 nm. An average particle size of the metal oxide fine particle may be less than or equal to about 1,000 nm, less than or equal to about 900 nm, less than or equal to about 800 nm, less than or equal to about 700 nm, less than or equal to about 600 nm, or less than or equal to about 500 nm. An average particle size of the metal oxide fine particle may be from about 100 nm to about 500 nm or from about 190 nm to about 450 nm, or from about 150 nm to about 300 nm. The size of the fine particle may be controlled in light of the amount of other components in the composition, a thickness of a film of the composite, and the like.

The metal oxide fine particle may include a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof. The metal oxide fine particle may include $TiO_2$, $SiO_2$, $BaTiO_3$, $Ba_2TiO_4$, $ZnO$, $HfO_2$, $ZrO_2$, $Al_2O_3$, $Ga_2O_3$, $In_2O_3$, $GeO_2$, $SnO_2$, $Sb_2O_3$, $Sc_2O_3$, $Y_2O_3$, $La_2O_3$, $RuO_2$, $CeO_2$, $TaO_2$, $Nb_2O_5$, or a combination thereof.

An amount of the metal oxide fine particle may be, based on a total weight of the composition, greater than or equal to about 0.01 weight percent (wt %), for example, greater than or equal to about 0.05 wt %, greater than or equal to about 0.1 wt %, greater than or equal to about 0.5 wt %, greater than or equal to about 1 wt %, or greater than or equal to about 1.5 wt %. An amount of the metal oxide fine particle may be, based on a total weight of the composition, less than or equal to about 50 wt %, for example, less than or equal to about 45 wt %, less than or equal to about 30 wt %, less than or equal to about 25 wt %, or less than or equal to about 20 wt %. Based on a total solid content (TSC), an amount of the metal oxide fine particle may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %. Based on a total solid content (TSC), an amount of the metal oxide fine particle may be less than or equal to about 60 wt %, less than or equal to about 50 wt %, less than or equal to about 40 wt %, or less than or equal to about 35 wt %.

Within the foregoing ranges of the particle size and the amount, the metal oxide fine particle may further increase luminous properties of a quantum dot polymer composite or a pattern thereof prepared from the photosensitive composition. The metal oxide fine particle may increase a refractive index of the composition (or the composite) and increase a path of excitation light to increase a chance for the light to meet the quantum dots in the composition or the composite. However, at an amount necessary for achieving the foregoing effects, the metal oxide fine particle (e.g., having a desired particle size) may tend to cause precipitation (sediment) in the composition. The sediment or precipitation of the metal oxide fine particle in the composition may cause serious defects in a final product. The sediment or precipitation caused by the metal oxide fine particles may lead to a substantial change in the solid content of the composition in a dispersed state and thereby cause deterioration of the uniformity of the final product (e.g., the quantum polymer composite pattern). In addition, the present inventors have found that some metal oxide fine particle as surface treated may cause irreversible changes on a surface of the quantum dot, which may lead to serious deterioration of the optical properties of the quantum dots and the composite including the quantum dots. Without wishing to be bound by any theory, it is believed that the surface treated metal oxide fine particles may result in the detachment of the ligand of the quantum dots.

In the composition of the embodiments, the metal oxide fine particle is surface treated with the organic compound represented by Chemical Formula 1, and thus may show enhanced dispersability without causing adverse effects on the quantum dots. Thus, the composition of the embodiments may be used in various processes (even in a slit coating process for mass production of a pattern) to produce a composite film or pattern. In addition, the prepared composite may show enhanced heat resistance and thus may suppress or reduce a decrease in the luminous properties of the quantum dot polymer composite that may otherwise occur during a heat treatment at a high temperature.

The composition of the embodiments may include a carboxylic acid group containing binder. The carboxylic acid group containing binder may have an acid value of greater than or equal to about 50 mg KOH/g, for example, greater than or equal to about for example, 80 mg KOH/g, greater than or equal to about 90 mg KOH/g, greater than or equal to about 100 mg KOH/g, greater than or equal to about 110 mg KOH/g, or greater than or equal to about 120 mg KOH/g and less than or equal to about 200 mg KOH/g, for example, less than or equal to about 190 mg KOH/g. The carboxylic acid group containing binder may have an acid value of from 100 to 190 mg KOH/g. The carboxylic acid group-containing binder includes a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group; a multiple aromatic ring-containing polymer including a carboxylic acid group and having a backbone structure in a main chain, wherein the backbone structure includes a quaternary carbon atom, which is a part of a cyclic group, and two aromatic rings bound to the quaternary carbon atom; or a combination thereof.

Using a photoluminescent type of color filter instead of the absorption type of color filter may widen the viewing angle and improve the luminance. The quantum dot may have a theoretical quantum yield (QY) of about 100%, and may emit light having high color purity (e.g., a full width at half maximum (FWHM) of less than or equal to about 40 nm), and thus it may achieve the enhanced luminous efficiency and the improved color reproducibility. For example, a pattern of a quantum dot polymer composite may be included in a photoluminescent color filter.

However, in order to provide a photoluminescent color filter based on the quantum dots, a photosensitive composition including quantum dots may be required to include a relatively large number of quantum dots (e.g., at least 5 wt % or even at least 10 wt % of the quantum dots based on the total amount of the composite), and in this case, it may become difficult to maintain the dispersability of the quantum dots. Thus, a negative type pattern forming process used for a production of the absorption type color filter cannot be utilized for a production of a quantum dot polymer composite pattern. For example, when the quantum dots are directly mixed with the alkali-developable photoresist without performing any surface treatment, serious agglomeration tends to occur and the patterning is impossible.

The present inventors have found that the foregoing carboxylic binder may allow the formation of a quantum dot binder dispersion, thereby substantially contributing to the dispersion of the quantum dots in the photosensitive composition.

In the photosensitive composition according to an embodiment, the quantum dot including an organic ligand (e.g., having a hydrophobic moiety) on the surface is first dispersed in a solution of a binder having a carboxylic acid group and a hydrophobic moiety to form a quantum dot-binder dispersion, which is then mixed with the other components for a photoresist. In this case, (for example, a relatively large amount of) the quantum dots may be dispersed well in the alkali-developable photoresist without showing serious agglomeration. Without wishing to be bound by any theory, it is believed that when the quantum dots dispersed in the solution of the carboxylic acid group-containing binder having a hydrophobic moiety, the binder may facilitate the formation of the dispersion including the quantum dots, and the quantum dots dispersed with the help of the binder may maintain their dispersed state even when they are in a photoresist composition.

Therefore, the photosensitive composition of the embodiments may include a quantum dot dispersion that includes a carboxylic acid group-containing binder and a plurality of the quantum dots dispersed (e.g., separated from one another) in the binder.

As the photosensitive composition according to an embodiment may provide a quantum dot-polymer composite pattern including the quantum dot with no photo-polymerizable functional group (e.g., no carbon-carbon double bond such as (meth)acrylate), a surface treatment may be omitted. In addition, a developing process for a pattern prepared from the aforementioned photosensitive composition does not require (i.e., may omit) a use of an organic solvent such as toluene or NMP in the developing process.

In the composition of the embodiments, the carboxylic acid group containing binder may include the copolymer of the aforementioned monomer combination; the aforementioned multiple aromatic ring-containing polymer; or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 1-A, a unit represented by Chemical Formula 1-B, or a combination thereof:

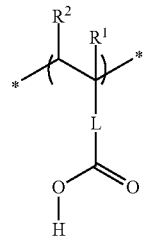

Chemical Formula 1-A wherein $R^1$ is hydrogen, a C1 to C3 alkyl group, or —$(CH_2)_n$—COOH (wherein n is 0 to 2), $R^2$ is hydrogen, a C1 to C3 alkyl group, or —COOH, L is a single bond, a divalent C1 to C15 aliphatic hydrocarbon group such as a C1 to C3 alkylene group, a divalent C6 to C30 aromatic hydrocarbon group such as a C6 to C12 arylene group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and

* indicates a portion linked to an adjacent atom;

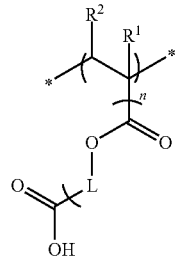

Chemical Formula 1-B wherein $R^1$ is hydrogen, a C1 to C3 alkyl group, or —$(CH_2)_m$—COOH (wherein m is 0 to 2), $R^2$ is hydrogen or a C1 to C3 alkyl group, L is a single bond, a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, n is an integer of 1 to 3, and

* indicates a portion linked to an adjacent atom.

As used herein, examples of the C3 to C30 alicyclic group include a cycloalkyl group such as a cyclohexyl group and a norbornyl group, a cycloalkenyl group such as a norbornenyl group, a cycloalkylene group such as a cyclohexylene group and a norbornane moiety, a cycloalkenylene group such as a cyclohexenylene group and a norbornene group, but are not limited thereto. As used herein, examples of the C6 to C30 aromatic hydrocarbon group includes a C6 to C30 aryl group such as a phenyl group, a naphthyl group, and the like, and a C6 to C30 (or C12) arylene group, but are not limited to. As used herein, examples of the aliphatic hydrocarbon include for example C1 to C15 alkyl group and C1 to C15 alkylene group, but are not limited thereto.

The second repeating unit may include a unit represented by Chemical Formula 2, a unit represented by Chemical Formula 4, a unit represented by Chemical Formula 5, a unit represented by Chemical Formula A, or a combination thereof:

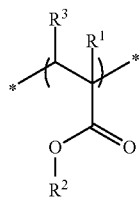

Chemical Formula 2 wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group (e.g., an arylalkyl group),
$R^3$ is hydrogen or a C1 to C3 alkyl group, and
* indicates a portion linked to an adjacent atom;

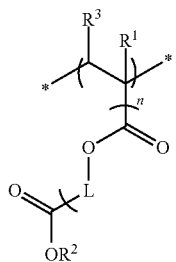

Chemical Formula 4 wherein
$R^1$ is hydrogen or a C1 to C3 alkyl group,
L is a single bond, a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
n is an integer of 1 to 3, and
* indicates a portion linked to an adjacent atom;

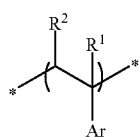

Chemical Formula 5 wherein
each of $R^1$ and $R^2$ is independently hydrogen or a C1 to C3 alkyl group,
Ar is a substituted or unsubstituted C6 to C30 aromatic hydrocarbon group or a substituted or unsubstituted C3 to C30 alicyclic hydrocarbon group, and
* indicates a portion linked to an adjacent atom;

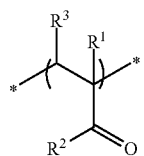

Chemical Formula A wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group, and
* indicates a portion linked to an adjacent atom.

The third repeating unit derived from the third monomer may be represented by Chemical Formula 3:

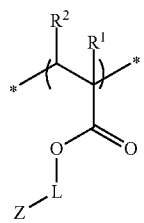

Chemical Formula 3 wherein
each of $R^1$ and $R^2$ is independently hydrogen or a C1 to C3 alkyl group,
L is a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
Z is a hydroxyl group (—OH), a mercapto group (—SH), or an amino group (—NHR, wherein R is hydrogen or a C1 to C5 alkyl group) and
* indicates a portion linked to an adjacent atom.

Examples of the first monomer may include, but are not limited to, acrylic acid, methacrylic acid, maleic acid, itaconic acid, fumaric acid, 3-butenoic acid, and carboxylic acid vinyl ester compounds such as vinyl acetate, and vinyl benzoate. The first monomer may include one or more compounds, i.e., two or more different compounds.

Examples of the second monomer may include, but are not limited to:
alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, or N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, at least one compound may be used, i.e., two or more different compounds may be used.

If present, examples of the third monomer may include 2-hydroxy ethyl acrylate, 2-hydroxy ethyl methacrylate, hydroxy propyl acrylate, hydroxy propyl methacrylate, hydroxy butyl acrylate, and hydroxy butyl methacrylate, but are not limited thereto. The third monomer may include one or more compounds, i.e., two or more different compounds.

In an embodiment, the binder polymer may be a copolymer of (meth)acrylic acid and at least one second or third monomer including an arylalkyl(meth)acrylate, a hydroxyalkyl (meth)acrylate, or styrene.

In some embodiments, an amount of the first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder polymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder polymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, if present, an amount of the third repeating unit derived from the third monomer, when present, may be greater than or equal to about 1 mol %, for example, greater than or equal to about 5 mol %, greater than or equal to about 10 mol %, or greater than or equal to about 15 mol %. In the binder polymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In the multiple aromatic ring-containing polymer of the binder, the backbone structure may include a repeating unit represented by Chemical Formula B

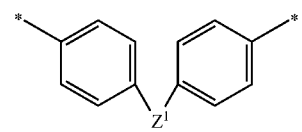

Chemical Formula B wherein

* indicates a portion that is linked to an adjacent atom of the main chain of the binder, $Z^1$ is a linking moiety represented by any one of Chemical Formulae B-1 to B-6, and in Chemical Formulae B-1 to B-6, * indicates a portion that is linked to an adjacent atom in the aromatic ring:

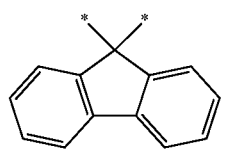

Chemical Formula B-1

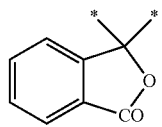

Chemical Formula B-2

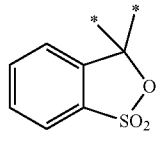

Chemical Formula B-3

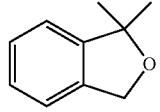

Chemical Formula B-4

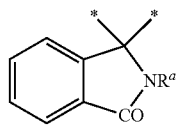

Chemical Formula B-5 wherein $R^a$ is hydrogen, an ethyl group, C2H4Cl, $C_2H_4OH$, $CH_2CH=CH_2$, or a phenyl group,

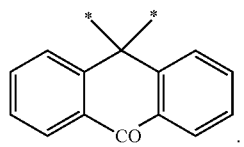

Chemical Formula B-6

The multiple aromatic ring-containing polymer may include a structural unit represented by Chemical Formula C:

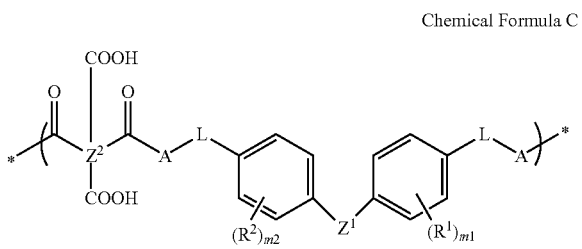

Chemical Formula C wherein $Z^1$ is a linking moiety represented by any one of Chemical Formulae B-1 to B-6, L is a single bond, a C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond, A is —NH—, —O—, a C1 to C10 alkylene, or a combination thereof, each of $R^1$ and $R^2$ is independently hydrogen, a halogen, or a substituted or unsubstituted C1 to C20 alkyl group, m1 and m2 are the same or different, and are independently an integer ranging from 0 to 4, $Z^2$ is a C6 to C40 aromatic organic group, and

* indicate a portion that is linked to an adjacent atom.

In Chemical Formula C, $Z^2$ may be any one of Chemical Formula C-1, Chemical Formula C-2, and Chemical Formula C-3:

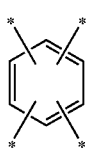

Chemical Formula C-1 wherein * indicates a portion that is linked to an adjacent carbonyl carbon,

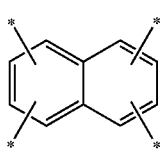

Chemical Formula C-2 wherein * indicates a portion that is linked to an adjacent carbonyl carbon,

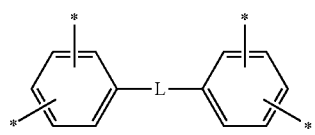

Chemical Formula C-3 wherein * indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein each R is independently hydrogen, a C1 to C10 aliphatic hydrocarbon group, a C6 to C20 aromatic hydrocarbon group, or a C3 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula D:

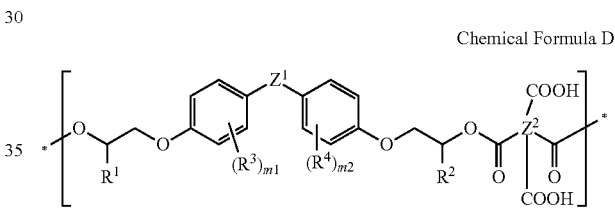

Chemical Formula D wherein each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by any of Chemical Formulae A-1 to A-6, $Z^2$ is an aromatic organic group such as the moieties set forth above, m1 and m2 are the same or different, and are independently an integer ranging from 0 to 4, and

* indicates a portion that is linked to an adjacent atom.

In some embodiments, the multiple aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as below:

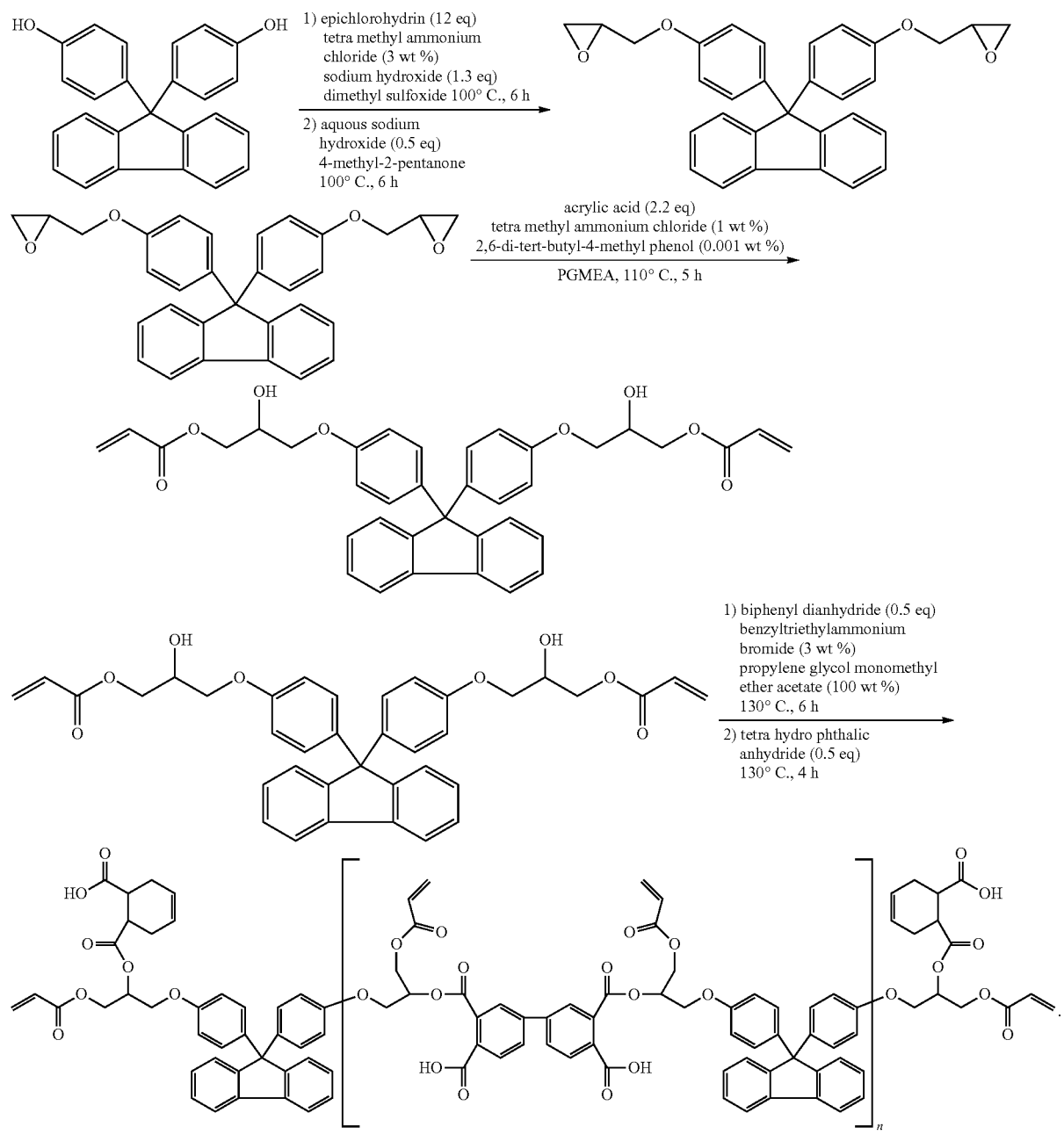

The multiple aromatic ring-containing polymer may include a functional group represented by Chemical Formula E at one or both terminal ends:

Chemical Formula E

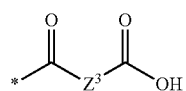

wherein

* indicates a portion that is linked to an adjacent atom, and $Z^3$ is a moiety represented by one of Chemical Formulae E-1 to E-7:

Chemical Formula E-1

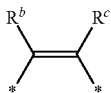

wherein each of $R^b$ and $R^e$ is independently hydrogen, a substituted or unsubstituted C1 to C20 alkyl group, a substituted or unsubstituted C1 to C20 alkyl group wherein at least one methylene is replaced with an ester group, an ether group, or a combination thereof and

* indicates a portion that is linked to an adjacent atom.

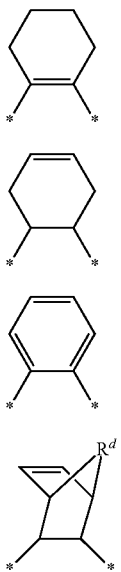

Chemical Formula E-2

Chemical Formula E-3

Chemical Formula E-4

Chemical Formula E-5 wherein $R^d$ is O, S, NH, a substituted or unsubstituted C1 to C20 alkylene group, a C1 to C20 alkylamine group, or a C2 to C20 alkenylamine group.

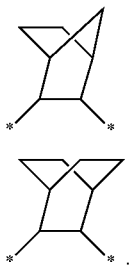

Chemical Formula E-6

Chemical Formula E-7

The multiple aromatic ring-containing polymer may be synthesized by a known method or is commercially available (e.g., from Nippon Steel Chemical Co., Ltd.).

As non-limiting examples, the multiple aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but is not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin; or a combination thereof.

The fluorene compound, the dianhydrides, the diol compound, and the like are commercially available, and the reaction conditions therebetween are known in the art.

The binder polymer (e.g., containing the carboxylic acid group) may have a molecular weight of greater than or equal to about 1,000 grams per mole (g/mol), for example, greater than or equal to about 2,000 g/mol, greater than or equal to about 3,000 g/mol, greater than or equal to about 5,000 g/mol, greater than or equal to about 7,000 g/mol or greater than or equal to about 9,000 g/mol. The binder polymer may have a molecular weight of less than or equal to about 100,000 g/mol, for example, less than or equal to about 90,000 g/mol, less than or equal to about 80,000 g/mol, less than or equal to about 70,000 g/mol, less than or equal to about 60,000 g/mol, less than or equal to about 50,000 g/mol, less than or equal to about 40,000 g/mol, less than or equal to about 30,000 g/mol, less than or equal to about 20,000 g/mol, or less than or equal to about 10,000 g/mol. Developability may be increased within such ranges.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition or the solid content thereof. An amount of the binder polymer may be less than or equal to about 60 wt %, for example, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %, based on the total weight of the composition or the solid content thereof.

In an embodiment, an amount of the binder polymer may be greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, or greater than or equal to about 8 wt %, based on the total weight of solids (i.e., non-volatiles) of the composition. In an embodiment, an amount of the binder polymer may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 35 wt %, based on the total weight of solids (i.e., non-volatiles) of the composition. While not wishing to be bound by theory, it is understood that within the aforementioned range, dispersibility of the quantum dots may be ensured while an appropriate level of developing and process properties may be achieved.

In some embodiments of the composition, the multi-thiol compound may include a compound represented by Chemical Formula 6:

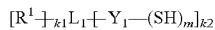

Chemical Formula 6 wherein

R¹ includes hydrogen, a substituted or unsubstituted C1 to C40 (or C1 to C30) linear or branched alkyl group, a C2 to C40 (or C1 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, L₁ includes a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, wherein at least one methylene (—CH₂—) of the substituted or unsubstituted C1 to C30 alkylene group or the substituted or unsubstituted C2 to C30 alkenylene group may be replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, Y₁ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of Y₁ when Y₁ is not a single bond, and provided that the sum of k1 and k2 does not exceed the valence of L₁.

The multi-thiol compound may include a compound represented by Chemical Formula 6-1:

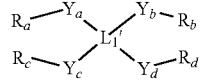

Chemical Formula 6-1 wherein

L₁' is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C2 to C30 heterocycloalkylene group, Y₍ₐ₎ to Y₍d₎ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of R₍ₐ₎ to R₍d₎ is independently R¹ of Chemical Formula 6 or SH, provided that at least two of them are SH.

The multi-thiol compound may react with a photopolymerizable monomer without an adverse effect on the dispersion of quantum dots, and thereby prevent the heat treatment (e.g., post-baking), which is accompanied by the photoresist process, from deteriorating the luminous efficiency of the quantum dots dispersed in the pattern. Without wishing to be bound by any theory, it is believed that the multi-thiol compound may allow the polymer to form a denser network by further reacting with the photopolymerizable monomer described later. In addition, the multi-thiol compound may provide a bond between the quantum dots and the photopolymerizable monomers to ensure the dispersion and the stability of the quantum dots in the composite. A pattern formed from the photosensitive resin composition including the multi-thiol compound may enhance the light emitting properties (such as a property of maintaining the blue-light conversion rate), for example, by at least about 2 times in comparison with the composite without the reactive compound. In some embodiments, the photosensitive composition may maintain a blue light conversion rate of greater than or equal to about 40% (e.g., greater than or equal to about 45% or greater than or equal to about 60%) of the initial value when it is developed by an alkali aqueous solution and then dried and heated at 180° C. for 30 min.

The multi-thiol compound may include a dithiol compound, a trithiol compound, a tetrathiol compound, or a combination thereof. For example, the multi-thiol compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In the photosensitive composition, the amount of the multi-thiol compound may be greater than or equal to about 0.1 wt %, for example, greater than or equal to about 0.5 wt %, greater than or equal to about 1 wt %, greater than or equal to about 2 wt %, greater than or equal to about 3 wt %, or greater than or equal to about 4 wt % based on the total weight of the composition. In the photosensitive composition, the amount of the multi-thiol compound may be less than or equal to about 50 wt %, for example, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, less than or equal to about 30 wt %, less than or equal to about 29 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, less than or equal to about based on the total weight of the composition.

In the photosensitive composition, the amount of the multi-thiol compound may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total solid content of the composition (or a total weight of the composite). Based on a total solid content of the composition (or a total weight of the composite), the amount of the multi-thiol compound may be less than or equal to about 55 wt %, for example, less than or equal to about 50 wt %, less than or equal to about 40 wt %, less than or equal to about 35 wt %, less than or equal to about 30 wt %, or less than or equal to about 27 wt %. The amount of the multi-thiol compound may be determined considering the patternability and the stability.

The photosensitive composition according to an embodiment includes a photopolymerizable monomer having at least one (e.g., two, three, four, five, six, or more) carbon-carbon double bond (e.g., an acrylate group or a methacrylate group). Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth)acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof.

The photopolymerizable monomer may include a mixture including a main monomer having 1 to 6 carbon-carbon double bonds (e.g., (meth)acrylate groups), a first accessory monomer having 8 to 20 (meth)acrylate groups, and a second accessory monomer represented by Chemical Formula 7:

$$R^1O\text{-}(L_1)_m\text{-}L_3\text{-}A\text{-}L_4\text{-}(L_2)_n\text{-}OR^2 \qquad \text{Chemical Formula 7}$$

wherein,

A is a divalent C1 to C40 aliphatic hydrocarbon group, a divalent C6 to C40 aromatic hydrocarbon group, a divalent moiety including two or more C6 to C40 aromatic hydrocarbon groups linked by a substituted or unsubstituted C1 to C10 alkylene, an ether, or a combination thereof, or an ether (—O—), $L_1$ and $L_2$ are the same or different, and are each independently a substituted or unsubstituted C2 to C5 oxyalkylene, m and n are an integer of 0 to 20, provided that they are not simultaneously 0, $L_3$ and $L_4$ are the same or different, and are each independently a single bond, —O—$(CH_2)_n$—CH(OH)—$CH_2$—, or —$(CH_2)_n$—CH(OH)—$CH_2$—, and $R^1$ and $R^2$ are the same or different, and are each independently $CR_2$=CR— (wherein, R is hydrogen or a methyl group) or $CR_2$=CRCO— (wherein, R is hydrogen or a methyl group).

The first accessory monomer may include a hyperbranched acrylated monomer. The first accessory monomer may include a dendrimer type (meth)acrylate monomer. The first accessory monomer may include one to four hydroxyl groups. The second accessory monomer may include bisphenol A di(meth)acrylate, bisphenol A epoxy(meth)acrylate, bisphenol A ethyleneglycol diacrylate monomer, or a combination thereof.

Based on a total weight of the photopolymerizable monomer mixture, the amount of the main monomer may be from about 60 wt % to about 90 wt %, the amount of the sum of the first accessory monomer and the second accessory monomer may be from about 10 wt % to about 40 wt %, and the amount of the second accessory monomer may be less than 100 parts by weight per 100 parts by weight of the first accessory monomer.

In an exemplary embodiment, when the photopolymerizable monomer composition has the aforementioned mixture of the photopolymerizable monomers, the resulting photosensitive composition may exhibit an improved level of patternability (e.g., breakpoint (BP) and critical dimension uniformity (CDUF)).

As used herein, the term 'breakpoint (BP)' refers to a time how long it takes a photosensitive composition to form a pattern noticeable by naked eye in a certain area from the center of the substrate after a coated film of the composition is exposed to UV light and a developing solution is sprayed onto the exposed region. Herein, the term, "Critical Dimension Uniformity (CDUF)" refers to an error range for a width of pattern having a predetermined resolution. The CDUF may be an index for evaluating the linearity of pattern and may be obtained by the following Equation:

$$\text{CDUF}=[(CD_{max}-CD_{min})/(CD_{max}+CD_{min})]\times 100(\%)$$

wherein $CD_{max}$ is the maximum width of the prepared pattern, and $CD_{min}$ is the minimum width of the prepared pattern.

Examples of the photopolymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, and the like. The photopolymerizable monomer of the embodiments may include a di(meth)acrylate compound, a tri(meth)acrylate compound, a tetra(meth)acrylate compound, a penta(meth)acrylate compound, a hexa(meth)acrylate compound, or a combination thereof.

In the photosensitive composition, the amount of the photopolymerizable monomer may be greater than or equal to about 0.5 wt %, for example, greater than or equal to about 1 wt %, or greater than or equal to about 2 wt % with respect to a total amount of the composition or the solid content of the composition. The amount of the photopolymerizable monomer may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, or less than or equal to about 10 wt % with respect to a total weight of the composition or the solid content of the composition.

The photosensitive composition includes a photoinitiator. Types of the photoinitiator are not particularly limited and may be selected appropriately. For example, the photopolymerization initiator that can be used may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, the examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, and 2,4-bis(trichloromethyl)-6-(4'-methoxy styryl)-s-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

Other than the foregoing photoinitiators, a carbazole compound, a diketone compound, a sulfonium borate compound, a diazo compound, a biimidazole compound may be used as a photoinitiator.

In the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In some embodiments, an amount of the photoinitiator may be greater than or equal to about 0.05 wt %, for example, greater than or equal to about 0.1 wt %, or greater than or equal to about 1 wt %, and less than or equal to about 15 wt %, for example, less than or equal to about 12 wt %, based on the solid content of the composition.

If desired, the photosensitive composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite. For example, if present, the amount of the additive may be greater than or equal to about 0.001 wt % and less than or equal to about 20 wt %, based on a total weight of the composition, but it is not limited thereto. The amount of the additive may be controlled as desired.

The light diffusing agent may include inorganic oxide particles such as alumina, silica, zirconia, titanium oxide, or zinc oxide particulates, and metal particles such as gold, silver, copper, or platinum, but is not limited thereto.

The leveling agent may prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and examples thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, and the like. Types and the amounts of the additives may be adjusted, if desired.

The photosensitive composition may further include an organic solvent. Types of the solvent available for the composition of the embodiments are not particularly limited. The solvent may be included in the quantum dot binder dispersion. Types and the amount of the solvent may be determined depending on the types and the amounts of the foregoing main components (i.e., the quantum dots, the COOH group-containing binder, the photopolymerizable monomer combination, the photoinitiator, and if present, the multi-thiol compound) and other additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for the alkali developing solution, and its boiling point.

Examples of the solvent may be: ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate and dipropylene glycol monoethyl ether acetate; amides such as N-methylpyrrolidone, dimethyl formamide, and dimethyl acetamide; ketones such as methyl ethyl ketone (MEK), methyl isobutyl ketone (MIBK), and cyclohexanone; petroleum products such as toluene, xylene, and solvent naphtha; esters such as methyl acetate, ethyl acetate, propyl acetate, butyl acetate, ethyl lactate, and cyclohexyl acetate; ethers such as diethyl ether, dipropyl ether, and dibutyl ether; and combinations thereof.

The photosensitive composition of the embodiments may be prepared by a method that includes:

obtaining a binder solution including (e.g., by mixing) a carboxylic acid group (—COOH)-containing binder and a solvent;

combining a plurality of quantum dots (that may have an organic ligand bound or coordinated to a surface thereof) with the solution to obtain a quantum dot dispersion; and combining the quantum dot dispersion with a multi-thiol compound, a photopolymerizable monomer having a carbon-carbon double bond, a photoinitiator, and a metal oxide fine particle, e.g., a plurality of metal oxide fine particles, including an organic compound represented by Chemical Formula 1 or a moiety derived therefrom.

The production method may further include reacting a metal oxide fine particle with the organic compound (conducting a reaction between, e.g., with, the hydroxyl group of the oxide fine particle and the moiety "A" of the organic compound) in an organic solvent at a temperature of greater than or equal to about 60° C. (for example, greater than or equal to about 70° C., greater than or equal to about 80° C., or greater than or equal to about 90° C.) to obtain the metal oxide fine particle including (e.g., having) an organic compound represented by Chemical Formula 1 bound to a surface of the metal oxide fine particle. The organic solvents and the times for the reaction (e.g., hydrolysis reaction) are not particularly limited and may be selected appropriately. The organic solvent does not react with the metal oxide fine particle and the organic compound and may disperse the metal oxide fine particle. Examples of the organic solvent may include an aromatic hydrocarbon, but are not limited thereto. The reaction time may be greater than or equal to about 10 minutes, for example, greater than or equal to about 20 minutes, greater than or equal to about 30 minutes, greater than or equal to about one hour, but is not limited thereto. In the hydrolysis reaction, the amount of the organic compound may be, per 100 parts by weight of the metal oxide fine particle, greater than or equal to about 0.01 parts by weight, greater than or equal to about 0.05 parts by weight, greater than or equal to about 0.1 parts by weight, greater than or equal to about 0.5 parts by weight, greater than or equal to about 1 parts by weight, greater than or equal to about 5 parts by weight, or greater than or equal to about 10 parts by weight. In the hydrolysis reaction, the amount of the organic compound may be, per 100 parts by weight of the metal oxide fine particle, less than or equal to about 100 parts by weight, less than or equal to about 90 parts by weight, less than or equal to about 80 parts by weight, or less than or equal to about 70 parts by weight.

A combining manner and/or a manner of the mechanical treatment is (are) not particularly limited, and may be selected appropriately. For example, each component may be combined sequentially or simultaneously. The method may further include selecting quantum dots including an organic ligand bonded to the surface, and selecting a binder capable of dispersing the quantum dots (e.g., a carboxylic acid group-containing binder). In the step of selecting the binder, a chemical structure and an acid value of the copolymer may be considered.

The photosensitive composition is polymerized to produce a quantum dot polymer composite. The photosensitive composition may form a quantum dot-polymer composite pattern without using an organic solvent developing solution. The polymerization may occur at predetermined area (for example, using a mask) and the non-polymerized portion is removed to develop a pattern of the quantum dot polymer composite. The developing process may use an aqueous alkaline solution and thus exclude the use of the organic solvent. A non-limiting method of forming a pattern is explained referring to FIG. 1.

The photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of greater than or equal to about 3 micrometers (μm) and less than or equal to about 30 μm). The formed film may be pre-baked, at a temperature near or below the boiling point of the solvent as used) if desired. The specific conditions (such as a temperature, a duration, and an atmosphere) for pre-baking may be appropriately selected.

The formed (or optionally, pre-baked) film is exposed to light of a predetermined wavelength under a mask having a predetermined pattern. The wavelength and the intensity of light may be selected depending on the types and the amounts of the photoinitiator, the types and the amounts of quantum dots, or the like.

The exposed selected area of the film is treated (e.g., sprayed or immersed) with an alkali developing solution, and thereby the unexposed region in the film is dissolved to provide a desired pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min). Even after the performing of the post-bake process, the pattern obtained from the photosensitive composition may show improved thermal stability, so that a maintenance percentage may be 30% or greater (e.g., 40% or greater, 50% or greater, 60% or greater, or 70% or greater). As used herein, the term "maintenance ratio" is a percentage of the light conversion rate of a quantum dot polymer composite or a pattern thereof after a heat treatment at a temperature of about 180° C. for 30 minutes with respect to the light conversion rate after being prebaked.

When a quantum dot-polymer composite obtained from the photosensitive composition is used as a color filter, two or three types of photosensitive compositions each including red light emitting quantum dots, green light emitting quantum dots, (or optionally, blue light emitting quantum dots) are prepared, and the patterning process is repeated as many times as necessary (e.g., two times or three times) for each composition to provide a quantum dot-polymer composite having a desirable pattern.

In some embodiments, a quantum dot-polymer composite includes a polymer matrix including a carboxylic acid group (—COOH)-containing binder and a polymerization product of a multi-thiol compound having at least two thiol at its end terminals and a photopolymerizable monomer; and a plurality of quantum dots dispersed in the polymer matrix; and a metal oxide fine particle including an organic compound represented by Chemical Formula 1 or a moiety derived from the organic compound at a surface of the metal oxide fine particle (and for example dispersed in the polymer matrix):

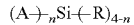   Chemical Formula 1 wherein n, A, and R are the same as defined above.

The metal oxide fine particle may be dispersed in the polymer matrix. For example, the quantum dot polymer composite may include the quantum dots and the metal oxide fine particles, and the quantum dots and the metal oxide fine particles may be distributed separately as a dispersion phase within the continuous phase of the polymer matrix. Each of the components of the composite are the same as set forth above.

Based on the total weight of the quantum dot polymer composite, the amount of the quantum dot may be greater than or equal to about 1 wt % and less than or equal to about 70 wt %, the amount of the metal oxide fine particle may be greater than or equal to about 1 wt % and less than or equal to about 50 wt %, and the amount of the polymer matrix may be greater than or equal to about 1 wt %, greater than or equal to about 10 wt %, greater than or equal to about 20 wt %, or greater than or equal to about 30 wt % and less than or equal to about 80 wt %, less than or equal to about 70 wt %, less than or equal to about 60 wt %, or less than or equal to about 50 wt %. The amount of the quantum dots and the amount of the metal oxide fine particle may correspond to the amounts recited above based on a total solid content of the composition.

The matrix may include a linear polymer (e.g., the binder) and a crosslinked polymer (e.g., the polymerization product). The quantum dot polymer composite may have a photo-conversion rate of greater than or equal to about 50% (e.g., greater than or equal to about 60%) of an initial value thereof after a 30 minute heat-treatment at a temperature of 180° C. The quantum dot polymer composite may be a pattern.

Figure 2:
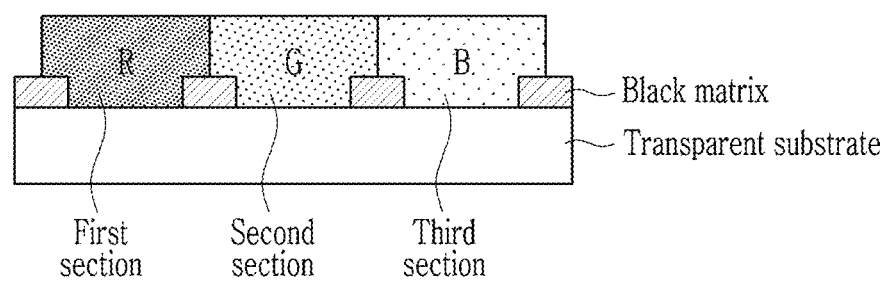
FIG. 2 is a schematic view showing an exemplary embodiment of a cross-section of a layered structure.

In some embodiments, a layered structure includes a substrate (e.g., a transparent substrate); and a luminescent layer (e.g., photoluminescent layer) disposed on the substrate and including a pattern of the quantum dot polymer composite, the pattern of the quantum dot polymer composite may include a repeating section including a first section configured to emit light of a first light. (see FIG. 2)

The (transparent) substrate may be a substrate including an insulating material. The insulating material may include glass; various polymers (e.g., a polyester such as polyethylene terephthalate (PET) or polyethylene naphthalate (PEN)), a polycarbonate, a polyimide, a polyamide-imide, a poly(meth)acrylate (such as a poly(C1 to C6 alkyl)(meth) acrylate), a thiol-ene polymer, a poly(meth)acrylic acid; a polysiloxane (e.g., polydimethylsiloxane (PDMS)); an inorganic material such as $Al_2O_3$ or ZnO; or a combination thereof, but is not limited thereto. As used herein, the term "transparent" refers to the case where light transmittance is greater than or equal to about 80%, for example, greater than or equal to about 85% or greater than or equal to about 90% for a predetermined light (e.g., that be emitted from the quantum dots included in the photoluminescent layer). A thickness of the substrate may be appropriately selected considering a substrate material but is not particularly limited. The substrate may have flexibility. The substrate may be an upper substrate of the liquid crystal panel.

The repeating section may further include a second section configured to emit a second light (e.g., a red light or a green light) that is different from the first light, a third section configured to emit a third light that is different from the first light and the second light, or a combination thereof. At least one of the second section and the third section may include the quantum dot polymer composite.

A maximum photoluminescent peak wavelength of the first section or the second section may be in a range of greater than about 480 nm and less than or equal to about 580 nm, for example, in a range of greater than about 500 nm and less than or equal to about 540 nm. A maximum photoluminescent peak wavelength of the second section or the first section may be in a range of greater than about 580 nm and less than or equal to about 680 nm, for example, in a range of greater than about 610 nm and less than or equal to about 640 nm. A maximum photoluminescent peak wavelength of the third repeating unit may be in a range of greater than or equal to about 380 and less than or equal to about 480 nm.

Details for the quantum dot polymer composite and its pattern are the same as set forth above.

The quantum dot polymer composite may be included in an electronic device. The electronic devices may include a light emitting diode (LED), an organic light emitting diode (OLED), a sensor, an imaging sensor, a solar cell, or a display device. The display device may be a liquid crystal display device or an OLED device. In some non-limiting embodiments, the aforementioned quantum dot polymer composite may be included in a quantum dot based color filter.

Figure 3:
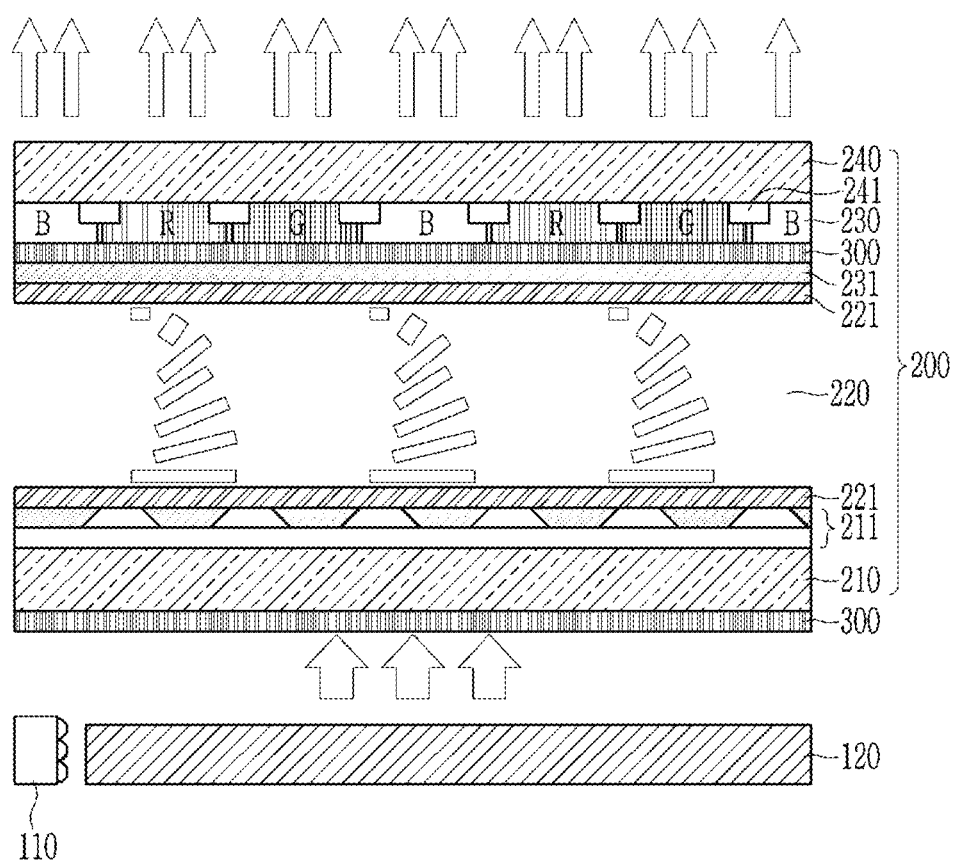
FIG. 3 is a cross-sectional view of an electronic device (a liquid crystal display device) according to an exemplary embodiment.
Figure 4:
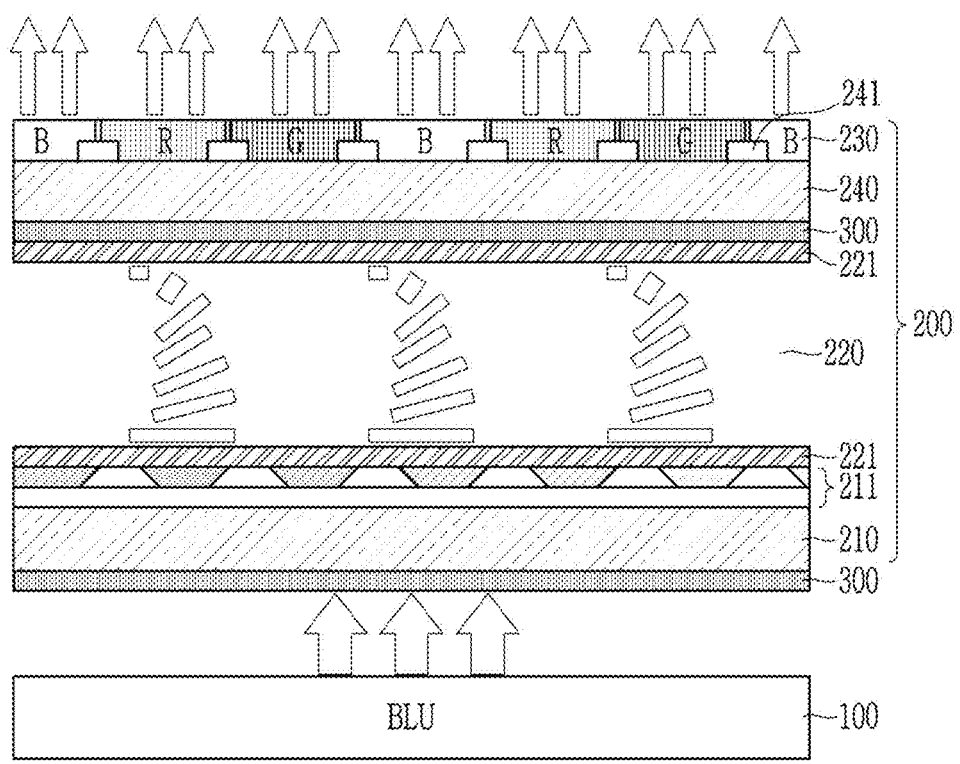
FIG. 4 is a cross-sectional view of an electronic device (a liquid crystal display device) according to an exemplary embodiment.

In some non-limiting embodiments, referring to FIG. 3 and FIG. 4, the liquid crystal display includes: a liquid crystal panel 200, an optical element 300 (e.g., a polarizing plate) that is disposed in and/or below the liquid crystal panel 200, and a back light unit that is disposed below the lower optical element 300 and includes a blue light emitting source. The liquid crystal panel 200 may include a lower substrate 210, an upper substrate 240, a liquid crystal layer 220 interposed between the upper and the lower substrates. The device include a color filter 230 disposed on a top surface or a bottom surface of the upper substrate 240. The color filter layer 230 includes the aforementioned quantum dot-polymer composite or a pattern thereof.

The back light unit may include a light source 110 and optionally a light guide panel 120.

A wire plate 211 is disposed on an internal surface, e.g., a top surface, of the lower substrate 210. The wire plate 211 may include a plurality of gate wires (not shown) and data wires (not shown), a thin film transistor disposed adjacent to a crossing region, e.g., intersection, of gate wires and data wires, and a pixel electrode for each pixel area, but is not limited thereto. In an embodiment, for example, pixel areas may be defined by the gate and data wires. The wire plate may have any structure or feature known in the art, and are not particularly limited.

The liquid crystal layer 220 may be disposed on or over the wire plate 211. The liquid crystal layer 220 may include alignment layers 221 on and under the layer 220 to initially align the liquid crystal material included therein. The liquid crystal material and the alignment layer may have any structure or feature known in the art (e.g., liquid crystal material, alignment layer material, method of forming liquid crystal layer, thickness of liquid crystal layer, or the like) and are not particularly limited.

The optical element 300 may be a member for maintaining polarization of light emitted from the photoluminescent color filter layer. In an embodiment, for example, the optical element 300 may be a polarizer. A black matrix 241 having an opening defined therethrough may be disposed on the upper substrate 240, e.g., the bottom surface of the upper substrate 240, to cover a thin film transistor and a gate line, a data line, or the like of the wire plate disposed on the lower substrate 210. A photoluminescent color filter layer 230 including a first color filter (R) for emitting red light, a second color filter (G) for emitting green light, and/or a third color filter (B) for (emitting or transmitting) blue light may be disposed on the black matrix 241 and in the opening of the black matrix 241. If desired, the photoluminescent layer may further include a fourth section, e.g., at least one fourth section. The fourth section may include a quantum dot emitting different colors (e.g., cyan, magenta, and yellow) from the light emitted from the first to third sections. In an exemplary embodiment, the black matrix 241 may have a lattice shape. A transparent common electrode 231 may be provided with the photoluminescent color filter layer.

The third section (B) configured to emit/transmit blue light may be a transparent color filter that does not change a light emitting spectrum of the light source. In this case, blue light emitted from the backlight unit (BLU) may pass the polarizer and the liquid crystal layer and then enter as a polarized light and go out as it is. If needed, the third section may include quantum dots emitting blue light.

If desired, the display device may further include a blue light blocking layer (blue cut filter). The blue cut filter may be disposed between a surface of the first section (R) and the second section (G) and the transparent substrate 300 or over the transparent substrate (not shown). The blue cut filter may be in the form of a sheet having an opening in a region corresponding to a pixel area (e.g., a third section) displaying blue and thus formed in a region corresponding to first and second sections. In an embodiment, the blue cut filter may be formed by alternately stacking at least two layers having different refractive indexes so as to transmit light in a wavelength region other than the blue light wavelength region and block the blue light. The blocked blue light may be reflected and recycled. The blue cut filter may block light emitted from a blue light source from being directly emitted outside.

A liquid crystal display (hereinafter, LCD) is a display in which polarized light passes through a liquid crystal and then an absorption-type color filter to express a color. The LCD often has drawbacks such as a narrow viewing angle and low luminance due to a low level of light transmittance of the absorption-type color filter. For example, in the conventional LCD including the absorption-type color filter, the light (e.g., the white light) provided from the back light unit passes through the color filter to provide red, green, and blue light, and thus the intensity of light is inevitably decreased by one third. In contrast, in the display of the embodiments, the blue light from the back light unit passes through the color filter to provide light having a desired color without the aforementioned light loss occurring in the conventional LCD including the absorption-type color filter. Therefore, the display of the embodiments may show a luminance efficiency that is at least about three times greater than that of that conventional LCD. In addition, as the display of the embodiments includes the photoluminescent color filter, it may emit light at substantially the same intensity in all directions, allowing a wider viewing angle.

Hereinafter, the embodiments are illustrated in more detail with reference to examples. However, the present disclosure is not limited thereto.

EXAMPLES

Analysis Method
[1] Photoluminescence Analysis
Hitachi F-7000 spectrometer is used to obtain a photoluminescence spectrum with irradiation light of 458 nanometers (nm) (532 nm for red light emitting quantum dot (QD)).
[2] Light Conversion Efficiency (CE)
Using QE 2100 of Otsuka Co., Ltd., a photoluminescence (PL) spectrum of the excitation light and a PL spectrum of the sample are obtained. A total amount of the excitation light (B) is obtained from the PL spectrum of the excitation light and a total amount of the converted light (e.g., having a red or green light wavelength) (A) and a total amount of the non-converted excitation light (B') are obtained from the PL spectrum of the sample. The conversion rate is calculated from the following equation:

$$A/(B-B') \times 100 = C.E. (\%)$$

The value of A/B may represent a quantum efficiency, the value of (B−B')/B may represent an excitation (e.g., blue) light absorption rate. Thus, the conversion efficiency (C.E.) may be represented by a percentage of the quantum efficiency with respect to the excitation light rate.
[3] Sedimentation Analysis
50 mL of the photosensitive composition is placed in a 100 mL measuring cylinder. After 72 hours elapse, whether a substantial phase separation (e.g., a phase separation of greater than or equal to about 5 mL) occurs is determined by a naked eye observation.

[Preparation of a Surface-Treated Metal Oxide Fine Particle and Evaluation of Dispersability of the Prepared Metal Oxide Fine Particle]

Example 1-1: Production of Surface Treated Metal Oxide Fine Particle and Dispersion Including the Same

[1] 1 g of $TiO_2$ (average particle size: 200 nm, purchased from ditto technology) and 0.7 g of the following organo silane compound are added to a flask and an organic solvent (toluene) is added thereto to prepare a solution (a total concentration of about 15 to 20 wt %):
Hexadecyltrimethoxysilane
Hexyltrimethoxysilane
3-Methacryloxypropyl trimethoxysilane, and
3-Mercaptopropyl trimethoxysilane.

The prepared solution is stirred for 6 hours at 100° C. to conduct a reaction.

After the end of the reaction, the reacted product is recovered via centrifugation, which is then vacuum-dried at room temperature for 2 hours, thereby producing a $TiO_2$ fine particle having the organosilane compound bound to a surface thereof.

Hereinafter, the $TiO_2$ fine particle surface treated with hexadecyltrimethoxysilane is referred to as "C16," the $TiO_2$ fine particle surface treated with the hexyltrimethoxysilane is referred to as "C6-100," the $TiO_2$ fine particle surface treated with the 3-methacryloxypropyl trimethoxysilane is referred to as "MA-100," and the $TiO_2$ fine particle surface treated with the 3-mercaptopropyl trimethoxysilane is referred to as "MPS."

Figure 5:
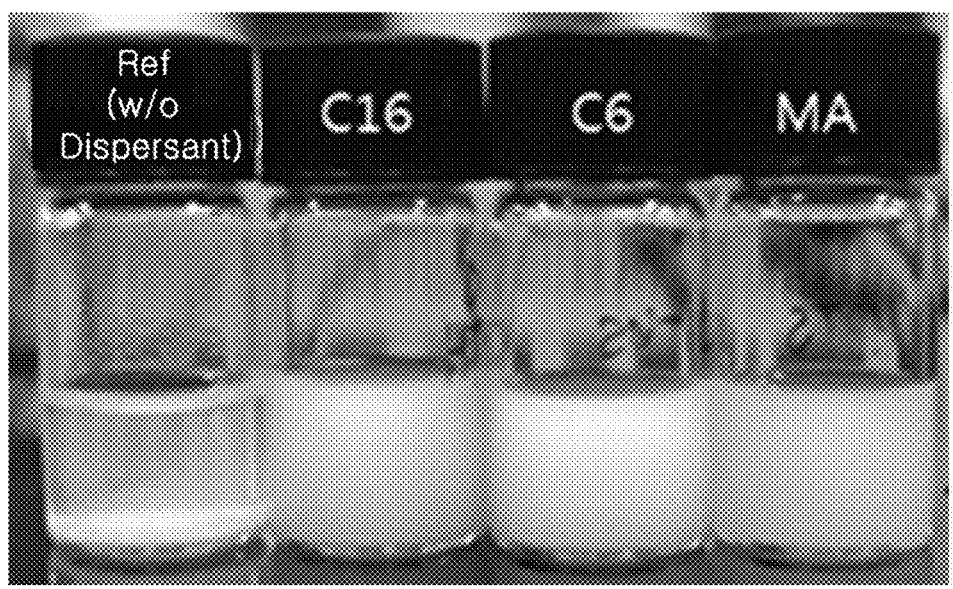
FIG. 5 is a photographic image of metal oxide fine particle dispersions prepared in Comparative Example 1 and Example 1-1.

[2] Each of the C16, the C6, the MA, and the MPS is dispersed in polypropylene glycol monomethyl ether acetate (PGMEA) to produce a dispersion of 1 wt % concentration (see FIG. 5). It is confirmed that the prepared dispersion does not show sedimentation after 72 hours.

[3] The C6 or the MA and a solution of a carboxylic acid group containing binder (a four membered copolymer of methacrylic acid, benzyl methacrylate, hydroxyethyl methacrylate, and styrene, acid value: 130 milligrams (mg) per gram of KOH (mg KOH/g), molecular weight: 8,000 g/mol, acrylic acid:benzyl methacrylate hydroxyethyl methacrylate:styrene (molar ratio)=61.5%:12%:16.3%:10.2%) in PGMEA at a concentration of 30 wt %) are added to PGMEA and dispersed using an ultrasonicator to obtain a $TiO_2$ (conc. 20 wt %)–binder (conc. 50%) PGMEA dispersion.

It is confirmed that the obtained dispersion maintains a dispersed state without noticeable aggregation even at a high concentration of $TiO_2$. (see FIG. 5)

Example 1-2

$TiO_2$ fine particles surface treated with hexyltrimethoxysilane and $TiO_2$ fine particles surface treated with 3-methacryloxypropyl trimethoxysilane are prepared in the same manner set forth in Example 1-1 except that 10 microliters (μL) of water is added to the prepared solution.

For the $TiO_2$ fine particles thus obtained, a PGMEA dispersion is prepared. It is confirmed that the obtained dispersion maintains a dispersed state without noticeable aggregation Example 1-3

$TiO_2$ fine particles surface treated with ethylene oxide oligomer is prepared in the same manner set forth in Example 1-1 except that an ethylene oxide oligomer having the following structure is used as the organic silane compound:

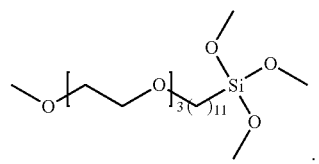

Example 1-4

$TiO_2$ fine particles surface treated with hexyltrimethoxysilane (hereinafter, C6-1) and $TiO_2$ fine particles surface treated with 3-methacryloxypropyl trimethoxysilane (hereinafter, MA-1) are prepared in the same manner set forth in Example 1-1 except that 0.007 g of hexyltrimethoxysilane and 0.007 g of 3-methacryloxypropyl trimethoxysilane are used, respectively.

Example 1-5

$TiO_2$ fine particles surface treated with hexyltrimethoxysilane (hereinafter, C6-10) and $TiO_2$ fine particles surface treated with 3-methacryloxypropyl trimethoxysilane (hereinafter, MA-10) are prepared in the same manner set forth in Example 1-1 except that 0.07 g of hexyltrimethoxysilane and 0.07 g of 3-methacryloxypropyl trimethoxysilane are used, respectively.

Comparative Example 1

$TiO_2$ fine particles without being reacted with the organosilane compound are used to produce a PGMEA dispersion (1 wt %) by using ultrasonicator. After one minutes, the $TiO_2$ fine particles are sedimented, e.g., precipitated, and a clear phase separation occurs. (see a sample denoted with "Ref." in FIG. 5)

Reference Example 1: Production of Red-Light Emitting or Green Light Emitting Quantum Dots (1) 0.2 millimoles (mmol) of indium acetate, 0.6 mmol of palmitic acid, and 10 milliliters (mL) of 1-octadecene are placed in a flask, subjected to a vacuum state at 120° C. for one hour, and heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene to obtain the InP core nanocrystals having a first excitonic absorption peak at a wavelength between about 420 nm and 600 nm.

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with $N_2$. Then, a toluene dispersion of the InP core nanocrystals prepared as described above (optical density: 0.15) and a predetermined amount of S/TOP (i.e., sulfur dissolved or dispersed in the trioctylphosphine) are added to the flask, and then, the resulting mixture is heated to 280° C., while the reaction proceeds for 30 minutes. After the reaction, the reaction solution is quickly cooled to room temperature to obtain a reaction mixture including InP/ZnS semiconductor nanocrystals.

(2) An excess amount of ethanol is added to the reaction mixture including the resulting semiconductor nanocrystals, which is then centrifuged to remove an extra organic material from the reaction mixture of the semiconductor nanocrystals. After centrifugation, the supernatant is discarded and the precipitate is dried and dispersed in chloroform to obtain a quantum dot solution (hereinafter, QD solution). An ultraviolet-visible (UV-Vis) absorption spectrum the QD solution is measured.

The prepared quantum dot including InP/ZnS semiconductor nanocrystals absorbs excitation light of 350 nm to 500 nm and emit (green) light having a maximum photoluminescent peak wavelength between about 520 nm and 550 nm or (red) light having a maximum photoluminescent peak wavelength between about 600 nm and 650 nm. The quantum yield of the prepared quantum dot is greater than or equal to about 50% (e.g., 50% to 100%).

Examples 2-1 to 2-5

[1] Preparation of Quantum Dot-Binder Dispersion

A chloroform dispersion of green light emitting quantum dots (InP/ZnS) is prepared. The chloroform dispersion of the quantum dot is mixed with the same binder solution of PGMEA having a concentration of 30 wt % as used in Example 1-1 to provide a quantum dot-binder dispersion. It is confirmed that quantum dots are uniformly dispersed in the quantum dot-binder dispersion.

[2] Preparation of the Photosensitive Composition

With the quantum dot-binder dispersion, ethylene glycol di-3-mercaptopropionate (hereinafter, 2T, as a multi-thiol compound) having the following structure, hexaacrylate having the following structure (as a photopolymerizable monomer), an oxime ester compound (as an initiator), each of the $TiO_2$ prepared in Examples 1-1, 1-3, 1-4, and 1-5 (C16, C6-100, MA-100, MPS, EO, C6-10, MA-10, C6-1, MA-1), and PGMEA (as a solvent) are mixed to obtain a photosensitive composition.

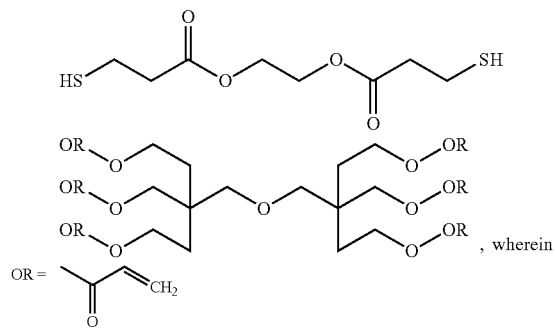

The photosensitive composition includes 9.25 wt % of the quantum dots, 6.11 wt % of the binder, 3.64 wt % of the photopolymerizable monomer, 0.5 wt % of the initiator, 2.5 wt % of the surface treated metal oxide fine particle, and 3 wt % of the multi-thiol compound. The total solid content of the composition is about 25 wt %, and a total QD weight content (TQWC) is about 37 wt %.

It is confirmed that the photosensitive composition thus prepared may form a dispersion without showing any noticeable agglomeration otherwise caused by the addition of the quantum dots. For the prepared composition, a sedimentation analysis is made. It is confirmed that all the prepared compositions do not show any substantial phase segregation after 72 hours.

[3] Formation of Quantum Dot-Polymer Composite Pattern

The photosensitive composition as obtained is spin-coated on a glass substrate at 180 revolutions per minute (rpm) for 5 seconds (s) to provide a film. The obtained film is pre-baked at 100° C. The pre-baked film is irradiated with light (wavelength: 365 nanometers (nm), intensity: 100 millijoules, mJ) for 1 s under a mask having a predetermined pattern and developed by a potassium hydroxide-diluted aqueous solution (concentration: 0.043%) for 50 s to provide a pattern (line width: 100 micrometers, μm) including quantum dots dispersed in a polymer.

Figure 6:
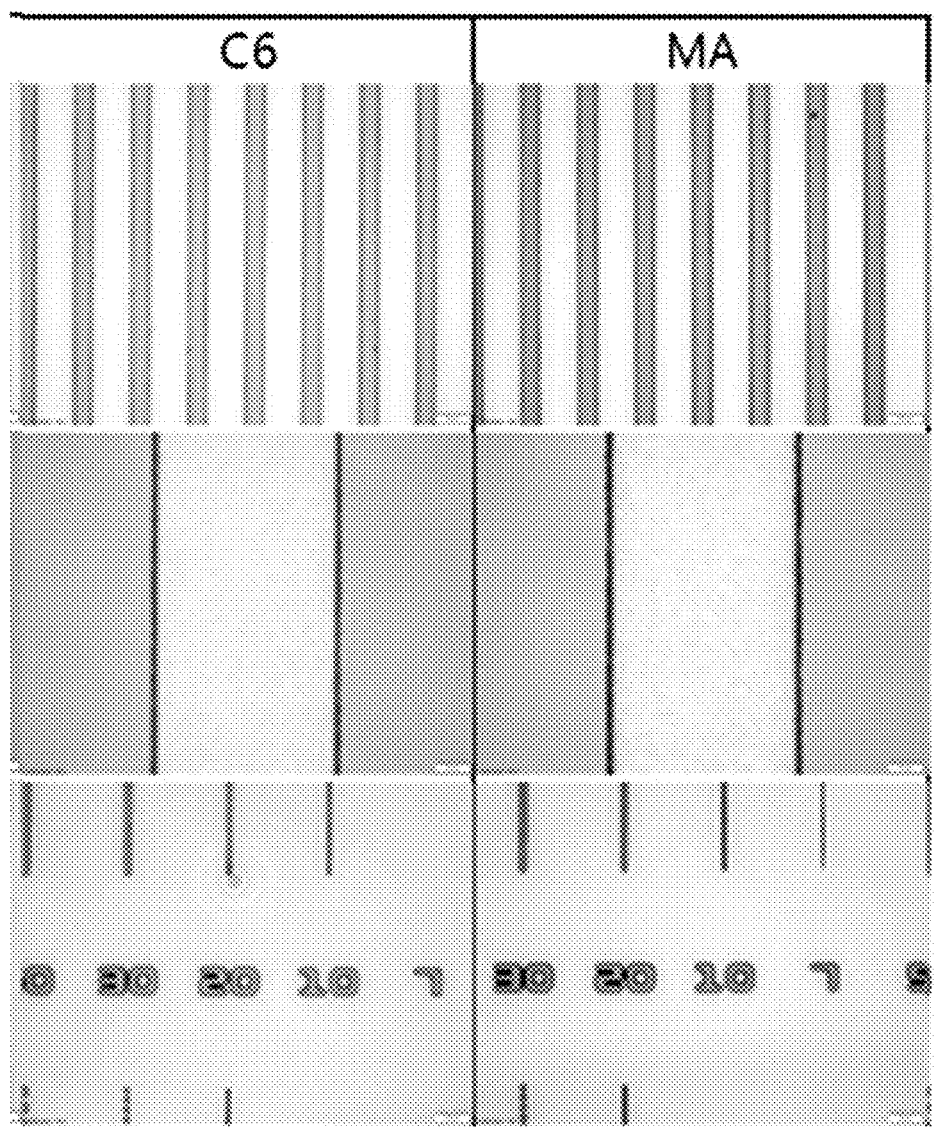
FIG. 6 is an optical microscopic image showing each of patterns of the quantum dot polymer composite prepared in Example 2-2 and Example 2-3.
Figure 7:
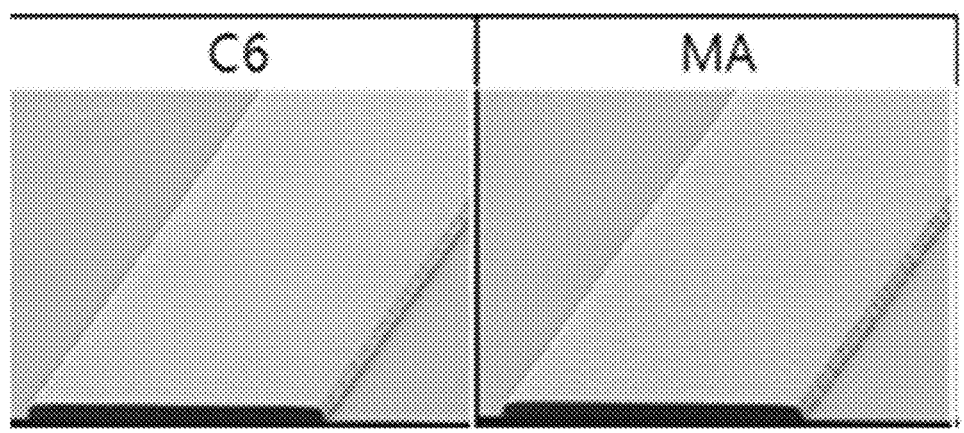
FIG. 7 is an optical microscopic image showing each of patterns of the quantum dot polymer composite prepared in Example 2-2 and Example 2-3.
Figure 8:
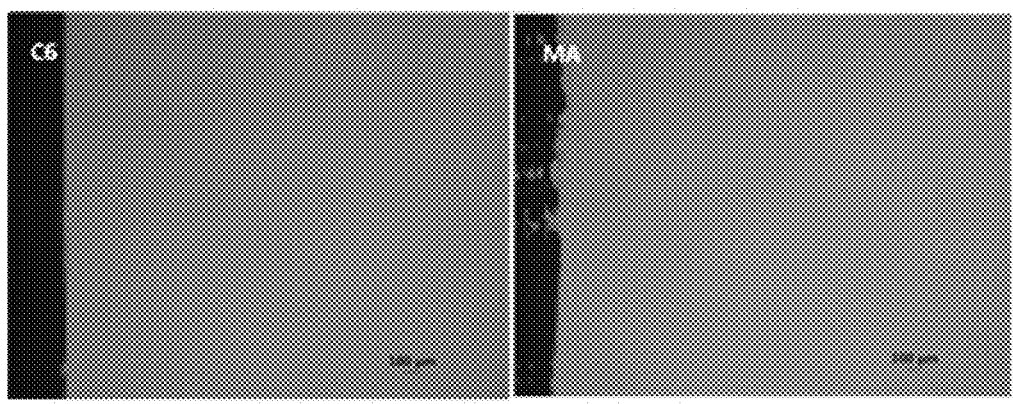
FIG. 8 is still an optical microscopic image showing each of patterns of the quantum dot polymer composite prepared in Example 2-2 and Example 2-3.

FIG. 6 and FIG. 7 show some of patterns (i.e., the pattern including C6 and MA). FIG. 8 shows an optical microscopic image of a surface of the pattern. These results confirm that the obtained quantum dot polymer composite films and patterns show a good shape and a uniform surface.

When the obtained pattern is irradiated with blue light (wavelength: 450 nm), red light is emitted from the pattern.

[4] Luminous Stability Test after the Post-Bake Treatment

The obtained pattern is subjected to 30 min of heating at 180° C. two times. For each time, the photoconversion efficiency is measured and the results are compiled in Table 2.

Comparative Example 2

A photosensitive composition is prepared to form a pattern in accordance with the same manner as in Example 2-1, except that $TiO_2$ fine particles surface treated with an amine compound (average particle diameter: 200 nm, purchased by Ditto technology) are added instead of the $TiO_2$ fine particle surface treated with the organic silane compound. The obtained pattern is subjected to 30 min of heating at 180° C. two times. For each time, the photoconversion efficiency is measured and the results are compiled in Table 2.

Comparative Example 3

A photosensitive composition and a quantum dot polymer composite pattern are prepared in the same manner as in Example 2-1, except for not using the multi-thiol compound and not using the $TiO_2$ fine particles. The obtained pattern is subjected to 30 min of heating at 180° C. two times. For each time, the photoconversion efficiency is measured and the results are compiled in Table 2.

TABLE 2

|  | Metal Oxide fine particle | Multi-thiol | C.E. % after Prebake (PrB) C.E. % | C.E. % after $2^{nd}$ POB | Maintenance ratio |
| --- | --- | --- | --- | --- | --- |
| Example 2-1 | C16 | 2T | 39 | 37 | 95 |
| Example 2-2 | C6-100 | 2T | 36 | 35 | 97 |
| Example 2-3 | MA-100 | 2T | 36 | 34 | 94 |

TABLE 2-continued

| | Metal Oxide fine particle | Multi-thiol | C.E. % after Prebake (PrB) C.E. % | C.E. % after 2nd POB | Maintenance ratio |
|---|---|---|---|---|---|
| Example 2-4 | MPS | 2T | 38 | 35 | 92 |
| Example 2-5 | EO | 2T | 37 | 35 | 95 |
| Example 2-6 | C6-10 | 2T | 37 | 34 | 92 |
| Example 2-7 | MA-10 | 2T | 38 | 34 | 89 |
| Example 2-8 | C6-1 | 2T | 39 | 35 | 90 |
| Example 2-9 | MA-1 | 2T | 38 | 35 | 92 |
| Comp. Ex 2 | Amine treated $TiO_2$ | 2T | 30 | 18 | 60 |
| Comp. Ex 3 | — | — | 24.9 | 5 | 20 |

Referring to Table 2, the quantum dot polymer composite of Examples 2-1 to 2-9 may show a conversion efficiency that is increased by at least seven times and a maintenance percentage that is increased by at least four times (400%) in comparison with the composite of Comparative Example 3. The quantum dot polymer composite of Examples 2-1 to 2-9 may show C.E. % and a maintenance percentage that are significantly improved in comparison with the composite of Comparative Example 2.

Examples 3-1 to 3-6

A photosensitive composition and a quantum dot polymer composite pattern are prepared in the same manner as in Example 2-1, except that a red light emitting quantum dot prepared in Reference Example 1 is used instead of the green-light emitting quantum dot and a composition set forth in Table 3 is prepared.

The photosensitive composition includes 7.5 wt % of the quantum dots, 5 wt % of the binder, 4 wt % of the photopolymerizable monomer, 0.125 wt % of the initiator, 3 wt % of the metal oxide fine particle, 6.25 wt % of the multi-thiol compound, and 1 wt % of the polymer stabilizer. The total solid content of the composition is about 25 wt %, and a total QD weight content (TQWC) is about 30 wt %.

The obtained pattern is subjected to 30 min of heating at 180° C. two times. For each time, the photoconversion efficiency is measured and the results are compiled in Table 3.

Comparative Example 4

A photosensitive composition is prepared to form a pattern in accordance with the same manner as in Example 3-1, except that $TiO_2$ fine particles surface treated with an amine compound (average particle diameter: 200 nm, purchased by Ditto technology) instead of the $TiO_2$ fine particle surface treated with the organic silane compound are added. The obtained pattern is subjected to 30 min of heating at 180° C. two times. For each time, the photoconversion efficiency is measured and the results are compiled in Table 3.

Comparative Example 5

A photosensitive composition and a quantum dot polymer composite pattern are prepared in the same manner as in Example 3-1, except for not using the multi-thiol compound and not using the $TiO_2$ fine particles. The obtained pattern is subjected to 30 min of heating at 180° C. two times. For each time, the photoconversion efficiency is measured and the results are compiled in Table 3.

TABLE 3

| | Metal Oxide fine particle | Multi-thiol | C.E. % after Prebake (PrB) C.E. % | C.E. % after 2nd POB | Maintenance ratio |
|---|---|---|---|---|---|
| Example 3-1 | C16 | 2T | 40 | 36 | 90 |
| Example 3-2 | C6-100 | 2T | 40 | 36 | 90 |
| Example 3-3 | MA-100 | 2T | 40 | 36 | 90 |
| Comp. Ex 4 | Amine treated TiO2 | 2T | 27.1 | 15 | 55 |
| Comp. Ex 5 | — | | 24.9 | 7.7 | 30 |

Referring to Table 3, the quantum dot polymer composite of Examples 3-1 to 3-3 may show a conversion efficiency that is increased by at least 4.6 times and a maintenance percentage that is increased by at least 3 times (300%) in comparison with the composite of Comparative Example 5. The quantum dot polymer composite of Examples 3-1 to 3-3 may show C.E. % and a maintenance percentage that are significantly improved in comparison with the composite of Comparative Example 4.

Comparative Example 6

The same binder solution, the same photopolymerizable monomer (a hexaacrylate compound), the same photoinitiator, glycol di-3-mercaptopropionate (hereinafter, 2T), and PGMEA are mixed at the same ratio as in Example 2-1 to prepare a mixture. Then, the same chloroform solution of the quantum dots as in Example 1 is added thereto to prepare a photosensitive composition.

Figure 9:
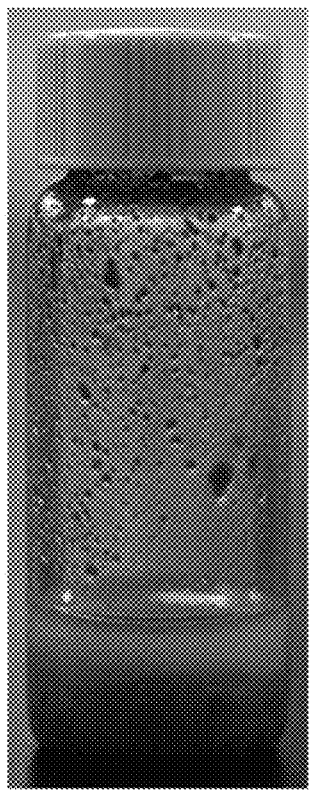
FIG. 9 is a photographic image showing the results of Comparative Example 6.

The photographic image of the obtained photosensitive composition is shown in FIG. 9. The results of FIG. 9 confirm that when the same quantum dot solution as in Example 1 is mixed with the same amount and the same type of binder, photopolymerizable monomer, photoinitiator, and solvent as in Example 1, the agglomeration of the quantum dots is significant, and thus a composition including the quantum dots dispersed therein cannot be obtained.

Comparative Examples 7 to 10

A photosensitive composition is prepared to form a pattern in accordance with the same procedure as in Example 2-1, except that no reactive compound is used (Comparative Example 7), or as a reactive compound, 10 g of a compound having one thiol group such as octadecyl thiol, methyl 3-mercaptopropionate (1T(H), Comparative Example 8), 1-dodecanethiol (1T(D) Comparative Example 9), and 3-Methoxybutyl mercaptoacetate (1T(A), Comparative Example 10) is used. The photoconversion efficiency for each of the prepared quantum dot polymer composite patterns is measured, and the results are shown in FIG. 10.

Figure 10:
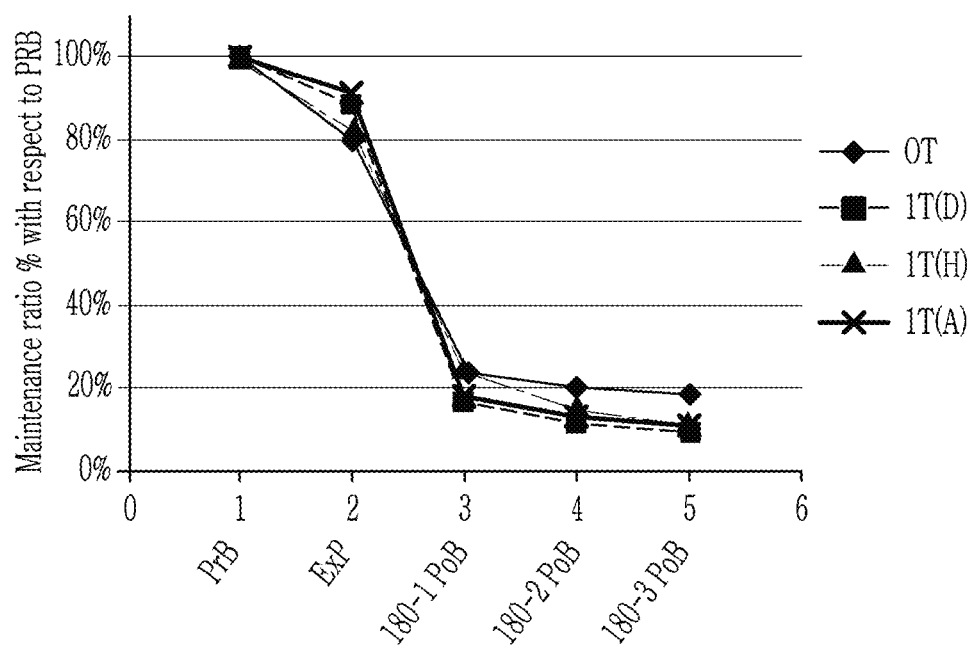
FIG. 10 is a graph of photoconversion rate (percent, %) with respect to that of the film after Prebake (PrB) versus heat treating times for the quantum dot-polymer composite pattern prepared in Comparative Examples 7 to 10.

The results of FIG. 10 confirm that the compound having one thiol group does not have an effect of increasing the maintenance ratio.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photosensitive composition comprising:
   a quantum dot;
   a carboxylic acid group-containing binder;
   a multi-thiol compound comprising at least two thiol groups at its terminal ends;
   a photopolymerizable monomer comprising a carbon-carbon double bond;
   a metal oxide fine particle;
   comprising an organic compound represented by Chemical Formula 1 or a moiety derived from the organic compound at a surface of the metal oxide fine particle;
   a photoinitiator; and
   a solvent:

$(A)_n Si(R)_{4-n}$  Chemical Formula 1 wherein n is an integer of 1 to 3,
   A is the same or different and is each independently a hydroxyl group, a C1 to C10 alkoxy group, chlorine, or a combination thereof,
   R is the same or different and is each independently a substituted or unsubstituted C3 to C40 aliphatic hydrocarbon; a C6 to C40 substituted or unsubstituted aromatic hydrocarbon; a substituted or unsubstituted C3 to C40 aliphatic hydrocarbon wherein at least one methylene group is replaced by a sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof; a moiety represented by Chemical Formula 1-1; or a combination thereof;

$R_1(L^1-O)_m R_2$—*  Chemical Formula 1-1 wherein $R_1$ is a substituted or unsubstituted C1 to C30 alkyl ether moiety, a substituted or unsubstituted C1 to C10 alkoxy group, or a substituted or unsubstituted C1 to C10 fluoroalkoxy group,
   $L^1$ is a C1 to C5 alkylene group or a C1 to C5 fluorinated alkyl group,
   $R_2$ is a single bond, a C1 to C20 alkylene group, or a C1 to C20 oxyalkylene group,
   ★ is a portion linked to Si, and
   m is 1 to 40.

2. The photosensitive composition of claim 1, wherein the quantum dot comprises a Group II-VI compound, a Group III-V compound, a Group IV-VI compound, a Group IV element or compound, a Group I-III-VI compound, a Group I-II-IV-IV compound, or a combination thereof.

3. The photosensitive composition of claim 1, wherein the carboxylic acid group-containing binder has an acid value of greater than or equal to about 50 milligrams of KOH per gram and less than or equal to about 250 milligrams of KOH per gram.

4. The photosensitive composition of claim 1, wherein the carboxylic acid group-containing binder comprises:
   a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally, a third monomer comprising a carbon-carbon double bond and a hydrophilic moiety and not comprising a carboxylic acid group;
   a multiple aromatic ring-containing polymer comprising a carboxylic acid group and comprising a backbone structure in a main chain, wherein the backbone structure comprises a quaternary carbon atom, which is a part of a cyclic group, and two aromatic rings bound to the quaternary carbon atom; or
   a combination thereof.

5. The photosensitive composition of claim 1, wherein the photopolymerizable monomer comprises a (meth)acrylate monomer having at least one (meth)acrylate group.

6. The photosensitive composition of claim 1, wherein the multi-thiol compound comprises a compound represented by Chemical Formula 6:

$[R^1]_{k1} L_1 [Y_1-(SH)_m]_{k2}$  Chemical Formula 6 wherein,
   $R^1$ is hydrogen, a substituted or unsubstituted C1 to C40 linear or branched alkyl group, a C2 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof,
   $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, or a substituted or unsubstituted C2 to C30 alkylene group or a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof,
   $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$ when $Y_1$ is not a single bond, and provided that a sum of k1 and k2 does not exceed the valence of $L_1$.

7. The photosensitive composition of claim 1, wherein the metal oxide fine particle comprises a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof.

8. The photosensitive composition of claim 1, wherein the metal oxide fine particle has an average particle size of greater than or equal to about 100 nanometers and less than or equal to about 1,000 nanometers.

9. The photosensitive composition of claim 1, wherein the organic compound comprises an organic silane compound represented by Chemical Formula 1-1-1:

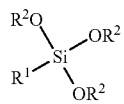

Chemical Formula 1-1-1 wherein $R^1$ is a C3 to C30 alkyl group, a C6 to C30 aryl group, a C3 to C30 mercaptoalkyl group, a C3 to C30 alkyl group substituted with (meth)acrylate group, a C3 to C30 alkyl group substituted with a vinyl group, a C3 to C30 alkyl group substituted with an epoxy group, or C6 to C30 aryl group, and $R^2$ are the same or different, and is each independently hydrogen or a C1 to C3 alkyl group.

10. The photosensitive composition of claim 1, wherein the organic compound comprises an organic silane oligomer represented by Chemical Formula 1-1-2, Chemical Formula 1-1-3, or Chemical Formula 1-1-4 and having a weight average molecular weight of greater than or equal to about 100 grams per mole and less than or equal to about 5,000 grams per mole:

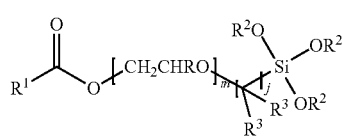

Chemical Formula 1-1-2 wherein $R^1$ is a C1 to C15 alkyl group,

R are the same or different, and is each independently hydrogen or a C1 to C5 alkyl group, m is an integer of 1 to 30, $R^2$ are the same or different, and is each independently hydrogen or a C1 to C3 alkyl group, $R^3$ are the same or different, and is each independently hydrogen or a methyl group, j is an integer of 1 to 20,

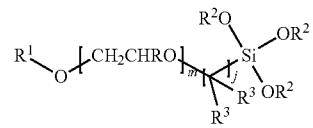

Chemical Formula 1-1-3 wherein $R^1$ is a C1 to C3 alkyl group,

R are the same or different, and is each independently hydrogen or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, j is an integer of 1 to 20,

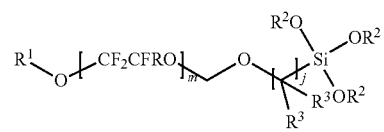

Chemical Formula 1-1-4 wherein $R^1$ is a C1 to C10 fluorinated alkyl group,

R are the same or different, and is each independently hydrogen, fluorine, or a C1 to C5 alkyl group, m is an integer of 1 to 30, $R^2$ are the same or different, and is each independently hydrogen or a C1 to C3 alkyl group, $R^3$ are the same or different, and is each independently hydrogen or methyl group, and j is an integer of 1 to 20.

11. The photosensitive composition of claim 1, wherein the photosensitive composition comprises a plurality of quantum dots and in the photosensitive composition, based on a total weight of the composition, an amount of the plurality of quantum dots is greater than or equal to about 1 weight percent and less than or equal to about 60 weight percent;

an amount of the carboxylic acid group-containing binder is greater than or equal to about 0.5 weight percent and less than or equal to about 60 weight percent;

an amount of the multi-thiol compound is greater than or equal to about 0.1 weight percent and less than or equal to about 50 weight percent;

an amount of the photopolymerizable monomer is greater than or equal to about 1 weight percent and less than or equal to about 70 weight percent;

an amount of the metal oxide fine particle is greater than or equal to about 0.01 weight percent and less than or equal to about 50 weight percent;

an amount of the photoinitiator is greater than or equal to about 0.01 weight percent and less than or equal to about 10 weight percent; and a balance amount is the solvent.

12. A method of producing the photosensitive composition of claim 1, the method comprising:

obtaining a binder solution comprising a carboxylic acid group-containing binder and a solvent;

combining a plurality of quantum dots with the solution to obtain a quantum dot dispersion; and combining the quantum dot dispersion with a multi-thiol compound, a photopolymerizable monomer comprising a carbon-carbon double bond, a photoinitiator, and a metal oxide fine particle comprising an organic compound represented by Chemical Formula 1 or a moiety derived therefrom on a surface thereof.

13. The method of claim 12, further comprises reacting a metal oxide fine particle with the organic compound in an organic solvent at a temperature of greater than or equal to about 60° C. to obtain the metal oxide fine particle comprising an organic compound represented by Chemical Formula 1 or a moiety derived therefrom on a surface thereof.

14. A quantum dot-polymer composite comprising:
a matrix comprising a carboxylic acid group-containing binder and a polymerization product of a multi-thiol compound comprising at least two thiol at its end terminals and a photopolymerizable monomer;
a plurality of quantum dots dispersed in the matrix; and
a metal oxide fine particle comprising an organic compound represented by Chemical Formula 1 or a moiety derived therefrom on a surface thereof:

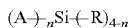  Chemical Formula 1 wherein n is an integer of 1 to 3,

A is the same or different and is each independently a hydroxyl group, a C1 to C10 alkoxy group, chlorine, or a combination thereof, R is the same or different and is each independently a substituted or unsubstituted C3 to C40 aliphatic hydrocarbon; a substituted or unsubstituted C6 to C40 aromatic hydrocarbon; a substituted or unsubstituted C3 to C40 aliphatic hydrocarbon wherein at least one methylene group is replaced by a sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof;

a moiety represented by Chemical Formula 1-1; or a combination thereof;

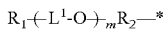  Chemical Formula 1-1 wherein R$_1$ is R'COO— (wherein R' is a substituted or unsubstituted C1 to C30 alkyl group), a substituted or unsubstituted C1 to C10 alkoxy group, or a substituted or unsubstituted C1 to C10 fluoroalkoxy group, L$^1$ is a C1 to C5 alkylene group or a C1 to C5 fluorinated alkyl group, R$_2$ is a single bond, a C1 to C20 alkylene group, or a C1 to C20 oxyalkylene group, is a portion linked to Si, m is 1 to 40.

15. The quantum dot-polymer composite of claim 14, wherein the carboxylic acid group-containing binder comprises a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally, a third monomer comprising a carbon-carbon double bond and a hydrophilic moiety and not comprising a carboxylic acid group;

a multiple aromatic ring-containing polymer comprising a carboxylic acid group and comprising a backbone structure in a main chain, wherein the backbone structure comprises a quaternary carbon atom, which is a part of a cyclic group, and two aromatic rings bound to the quaternary carbon atom; or a combination thereof.

16. The quantum dot-polymer composite of claim 14, wherein the metal oxide fine particle comprises a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof.

17. The quantum dot-polymer composite of claim 14, wherein the metal oxide fine particle has an average particle size of greater than or equal to about 100 nanometers and less than or equal to about 1,000 nanometers.

18. The quantum dot-polymer composite of claim 14, wherein the organic compound comprises an organic silane compound represented by Chemical Formula 1-1-1:

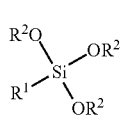  Chemical Formula 1-1-1 wherein R$^1$ is a C3 to C30 alkyl group, a C6 to C30 aryl group, a C3 to C30 mercaptoalkyl group, a C3 to C30 alkyl group substituted with (meth)acrylate group, a C3 to C30 alkyl group substituted with a vinyl group, a C3 to C30 alkyl group substituted with an epoxy group, or a substituted or unsubstituted C6 to C30 aryl group; and R$^2$ are the same or different, and is each independently hydrogen or a C1 to C3 alkyl group.

19. The quantum dot-polymer composite of claim 14, wherein the organic compound comprises an organic silane oligomer represented by Chemical Formula 1-1-2, Chemical Formula 1-1-3, or Chemical Formula 1-1-4 and having a weight average molecular weight of greater than or equal to about 100 grams per mole and less than or equal to about 5,000 grams per mole:

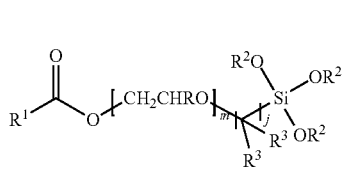  Chemical Formula 1-1-2 wherein R$^1$ is a C1 to C15 alkyl group,

R are the same or different, and is each independently hydrogen or a C1 to C5 alkyl group, m is an integer of 1 to 30, R$^2$ are the same or different, and is each independently hydrogen or a C1 to C3 alkyl group, R³ are the same or different, and is each independently hydrogen or a methyl group, j is an integer of 1 to 20, Chemical Formula 1-1-3

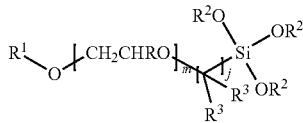

wherein R¹ is a C1 to C3 alkyl group,

R are the same or different, and is each independently hydrogen or a C1 to C5 alkyl group, m is an integer of 1 to 30, R² are the same or different, and is each independently hydrogen or a C1 to C3 alkyl group, R³ are the same or different, and is each independently hydrogen or methyl group, j is an integer of 1 to 20, Chemical Formula 1-1-4

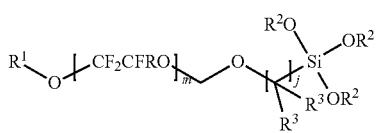

wherein R¹ is a C1 to C10 fluorinated alkyl group,

R are the same or different, and is each independently hydrogen, fluorine, or a C1 to C5 alkyl group, m is an integer of 1 to 30, R² are the same or different, and is each independently hydrogen or a C1 to C3 alkyl group, R³ are the same or different, and is each independently hydrogen or methyl group, j is an integer of 1 to 20.

20. The quantum dot-polymer composite of claim 14, wherein an amount of the plurality of quantum dots is greater than or equal to about 1 weight percent and less than or equal to about 70 weight percent, an amount of the metal oxide fine particle is greater than or equal to about 1 weight percent and less than or equal to about 50 weight percent, and an amount of the matrix is greater than or equal to about 1 weight percent and less than or equal to about 80 weight percent, based on a total weight of the composite.

21. A layered structure comprising:

a substrate; and a luminescent layer disposed on the substrate and comprising a pattern of the quantum dot-polymer composite of claim 14, wherein the pattern of the quantum dot-polymer composite comprises a repeating section comprising a first section configured to emit a first light.

22. The layered structure of claim 21, wherein the repeating section comprises a second section configured to emit a second light different from the first light, a third section configured to emit or pass a third light different from the first light and the second light, or a combination thereof.

* * * * *